United States Patent
Gwak

(10) Patent No.: US 9,385,002 B2
(45) Date of Patent: Jul. 5, 2016

(54) SEMICONDUCTOR DEVICES AND FABRICATING METHODS THEREOF

(71) Applicant: Samsung Electronics Co., Ltd., Suwon-si (KR)

(72) Inventor: Byoung-Yong Gwak, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/503,662

(22) Filed: Oct. 1, 2014

(65) Prior Publication Data
US 2015/0093895 A1 Apr. 2, 2015

(30) Foreign Application Priority Data
Oct. 1, 2013 (KR) .................. 10-2013-0117335

(51) Int. Cl.
*H01L 21/3213* (2006.01)
*H01L 49/02* (2006.01)
*H01L 27/108* (2006.01)

(52) U.S. Cl.
CPC .... *H01L 21/32134* (2013.01); *H01L 27/10817* (2013.01); *H01L 27/10855* (2013.01); *H01L 28/91* (2013.01); *H01L 28/92* (2013.01); *H01L 27/10814* (2013.01)

(58) Field of Classification Search
CPC .............. H01L 21/32134; H01L 28/91; H01L 27/10817; H01L 28/92; H01L 27/10855; H01L 27/10814
See application file for complete search history.

(56) References Cited

U.S. PATENT DOCUMENTS

| | | | |
|---|---|---|---|
| 7,273,781 B2 | 9/2007 | Lee | |
| 7,692,179 B2 | 4/2010 | Islam et al. | |
| 2003/0009866 A1 | 1/2003 | Kashihara | |
| 2007/0164390 A1* | 7/2007 | Vasilyeva et al. | 257/499 |
| 2010/0248449 A1* | 9/2010 | Hildreth et al. | 438/460 |
| 2011/0237043 A1 | 9/2011 | Kim et al. | |
| 2013/0171818 A1* | 7/2013 | Kim et al. | 438/664 |

FOREIGN PATENT DOCUMENTS

| | | | |
|---|---|---|---|
| JP | 2004-247643 | 9/2004 | |
| JP | 2007-258603 | 10/2007 | |
| KR | 1020040002219 | 1/2004 | |
| KR | 1020050050273 | 5/2005 | |
| KR | 1020060106317 | 10/2006 | |
| KR | 1020130023749 | 3/2013 | |
| KR | 1020130023770 | 3/2013 | |
| WO | WO-2010117201 A1 * | 10/2010 | H01L 21/027 |

OTHER PUBLICATIONS

Machine Translation of WO-2010117201 A1.*
S. Chang et al. Adv. Funct. Mater. 2010, 20, 4363-4370.*
Z. Huang et. al. NanoLetters, 2009, 9.7, 2519-2525.*

* cited by examiner

*Primary Examiner* — Michelle Mandala
(74) *Attorney, Agent, or Firm* — Myers Bigel & Sibley, P.A.

(57) ABSTRACT

Fabricating methods of a semiconductor device are provided. The fabricating methods may include forming a mold layer, forming a catalyst pattern including noble metal on the mold layer and etching the mold layer using the catalyst pattern as a catalyst. Etching the mold layer may include performing a wet etching process.

21 Claims, 35 Drawing Sheets

SEMICONDUCTOR DEVICES AND FABRICATING METHODS THEREOF

CROSS-REFERENCE TO RELATED APPLICATION

This U.S. non-provisional application claims priority under 35 U.S.C. §119 to Korean Patent Application No. 10-2013-0117335 filed on Oct. 1, 2013 in the Korean Intellectual Property Office, the disclosure of which is hereby incorporated by reference herein in its entirety.

BACKGROUND

The present disclosure generally relates to the field of electronics and, more particularly, to integrated circuit devices.

Dynamic Random Access Memory (DRAM) devices store data in capacitors therein. The capacitors may store data 1 and data 0 according to whether the capacitors are charged or discharged. However, since the capacitors may slowly discharge, data stored in the capacitors may be lost. Accordingly, periodic refresh operations may be necessary for DRAM devices.

As integrated circuit devices are highly integrated, research has been conducted to manufacture capacitors having a high capacitance value.

SUMMARY

A method of fabricating a semiconductor device may include forming an interlayer dielectric layer on a substrate, forming a storage node contact passing through the interlayer dielectric layer, forming a mold layer on the interlayer dielectric layer and the storage node contact and forming a storage node hole, which may laterally overlap with the storage node contact, in the mold layer by etching the mold layer. Etching the mold layer may include etching the mold layer using a noble metal pattern as a catalyst.

According to various embodiments, the method may further include forming a mask pattern on the mold layer including a recess that exposes the mold layer and forming the noble metal pattern in the recess on the mold layer. Etching the mold layer may include performing a wet etching process using the noble metal pattern as a catalyst.

In various embodiments, performing the wet etching process may include performing the wet etching process using an etchant including $H_2O_2/HF$, HCl, $H_3PO_4$ or $H_2SO_4$.

According to various embodiments, the method may also include removing the noble metal pattern after etching of the mold layer.

According to various embodiments, upper and lower portions of the storage node hole may have a substantially equivalent width.

A method of fabricating a semiconductor device may include forming an interlayer dielectric layer on a substrate, forming a storage node contact passing through the interlayer dielectric layer and forming an etching stop layer on the interlayer dielectric layer. The method may also include forming a mold layer on the etching stop layer, forming a storage node hole, which may laterally overlap with the storage node contact, in the mold layer and forming a first electrode in the storage node hole. A noble metal pattern that includes a noble metal different from the first electrode may be disposed between the storage node contact and the first electrode, and upper and lower portions of the storage node hole may have a substantially equivalent width.

According to various embodiments, forming the storage node hole may include forming the storage node hole using the noble metal pattern as a catalyst.

In various embodiments, the method may further include forming a mask pattern on the mold layer including a recess that exposes the mold layer and forming the noble metal pattern in the recess on the mold layer.

In various embodiments, forming the noble metal pattern in the recess may include forming a noble metal layer on the mask pattern including the recess and removing a portion of the noble metal layer until an uppermost surface of the mask pattern is exposed.

In various embodiments, the method may further include removing the mask pattern after forming the storage node hole.

According to various embodiments, the mold layer may include polysilicon

According to various embodiments, the noble metal pattern may include Ag, Au, Pt, Al or Cu.

According to various embodiments, forming the first electrode may include forming the first electrode having a pillar shape.

In various embodiments, the method may further include forming a dielectric layer on a sidewall and an upper surface of the first electrode and an upper surface of the etching stop layer.

In various embodiments, the method may further include forming a second electrode on the dielectric layer and forming a capping layer on the second electrode.

A method of forming an integrated circuit device may include forming a mold layer on a substrate, forming a mask layer on the mold layer. The mask layer may include a first recess exposing an upper surface of the mold layer. The method may also include forming a catalyst pattern in the first recess on the upper surface of the mold layer and etching the mold layer using the catalyst pattern as a catalyst to form a second recess in the mold layer. The catalyst pattern may include noble metal and the catalyst pattern may define a lowermost surface of the second recess.

According to various embodiments, the noble metal may include Ag, Au, Pt, Al or Cu.

In various embodiments, etching the mold layer may include performing a wet etching process using an etchant including $H_2O_2/HF$, HCl, $H_3PO_4$ or $H_2SO_4$.

In various embodiments, the mold layer may include polysilicon.

According to various embodiments, the method may additionally include forming an insulating layer including a storage contact node on the substrate before forming the mold layer and forming a lower electrode of a capacitor in the second recess. The catalyst pattern may contact an uppermost surface of the storage contact node after the second recess is formed.

In various embodiments, the method may also include removing the catalyst pattern before forming the lower electrode of the capacitor.

In various embodiments, the method may also include forming an etching stop layer on the insulating layer before forming the mold layer and etching the etching stop layer using the catalyst pattern as a catalyst after etching the mold layer to form a third recess in the etching stop layer. The catalyst pattern may be in the third recess and may contact the etching stop layer.

According to various embodiments, the catalyst pattern and upper and lower portions of the second recess may have a substantially equivalent width.

DETAILED DESCRIPTION

Figure 1:
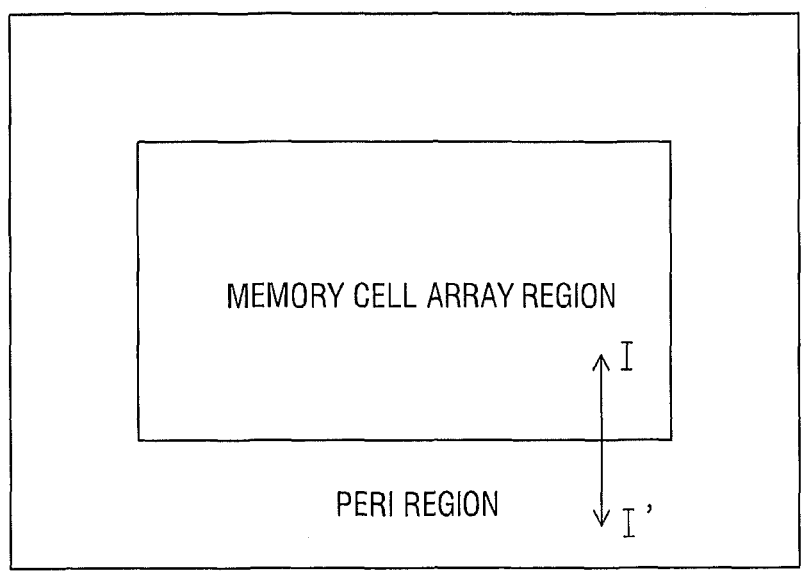
FIG. 1 is a diagram of a semiconductor device according to some embodiments of the present inventive concept.

Some embodiments according to the present inventive concepts are described below with reference to the accompanying drawings. The present inventive concept may, however, be embodied in many different forms and should not be construed as being limited to the embodiments set forth herein. Rather, these embodiments are provided so that this disclosure will be thorough and complete and will fully convey the concept of the present inventive concept to those skilled in the art. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising", "includes" or "including" when used in this specification, specify the presence of stated features, steps, operations, elements, and/or components, but do not preclude the presence or addition of one or more other features, steps, operations, elements, components, and/or groups thereof.

It will be understood that when an element or layer is referred to as being "on," "connected to" or "coupled to" another element or layer, it can be directly on, directly connected to or directly coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized embodiments and intermediate structures. As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. The regions illustrated in the figures are schematic in nature and their shapes are not intended to illustrate actual shapes of the regions and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Some embodiments of the present inventive concept will be described with regard to a DRAM device, but aspects of the present inventive concept are not limited thereto.

Figure 2A:
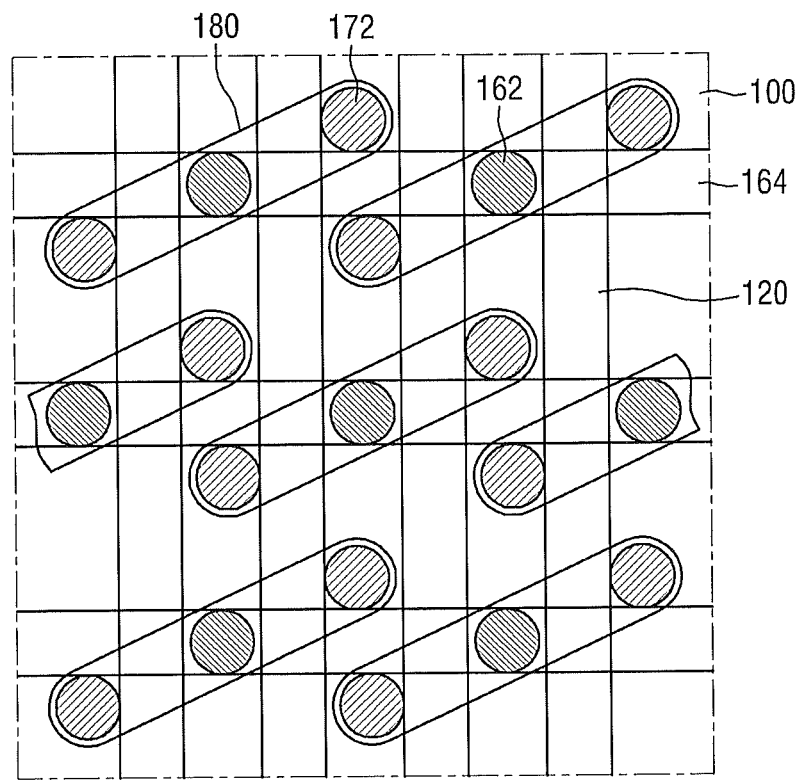
FIG. 2A is a layout of a portion of a memory cell array region.
Figure 2A:
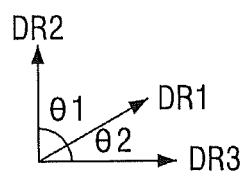
Figure 2B:
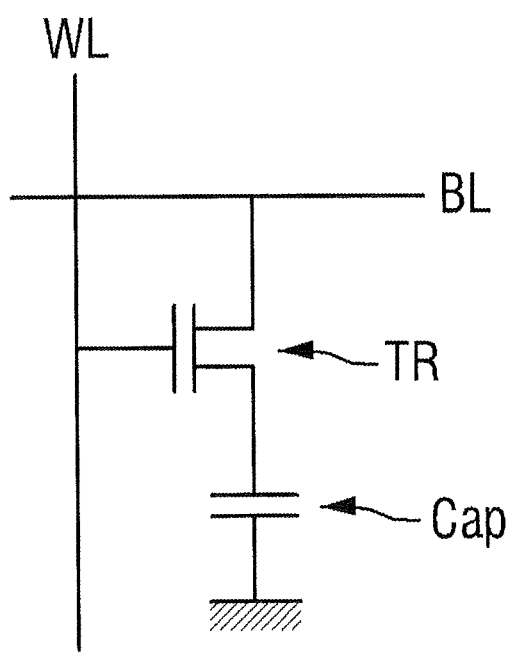
FIG. 2B is a circuit diagram of a memory cell in the memory cell array region.
Figure 3A:
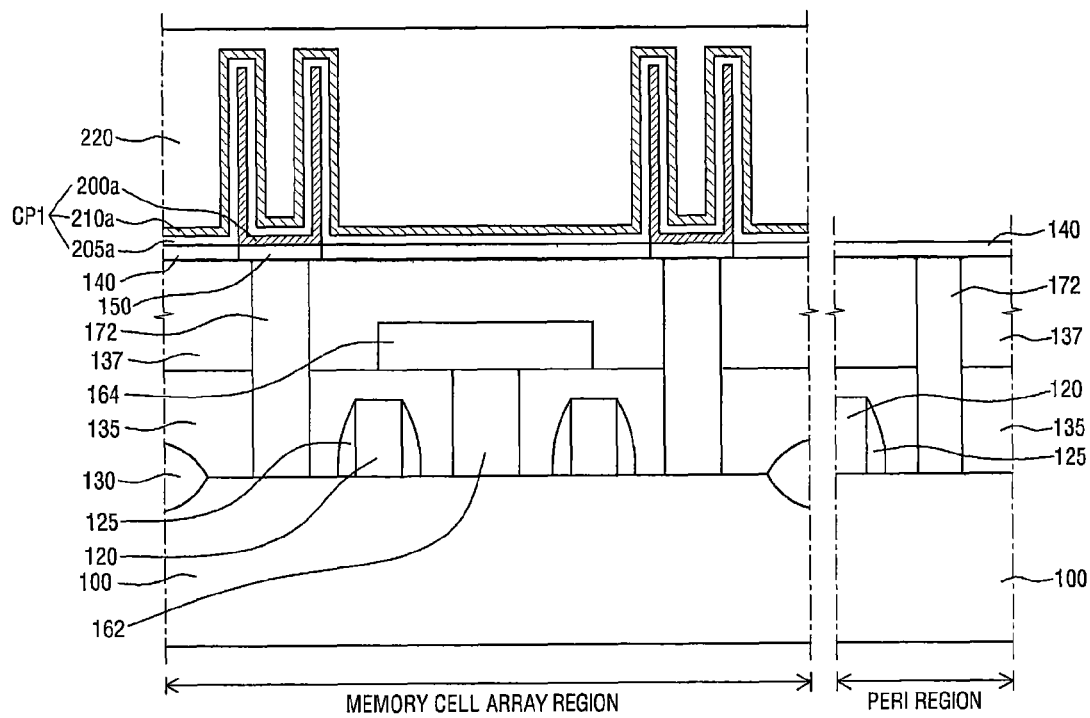
FIGS. 3A, 3B and 3C are cross-sectional views taken along the line I-I' of FIG. 1 of a semiconductor device according to some embodiments of the present inventive concept.
Figure 3B:
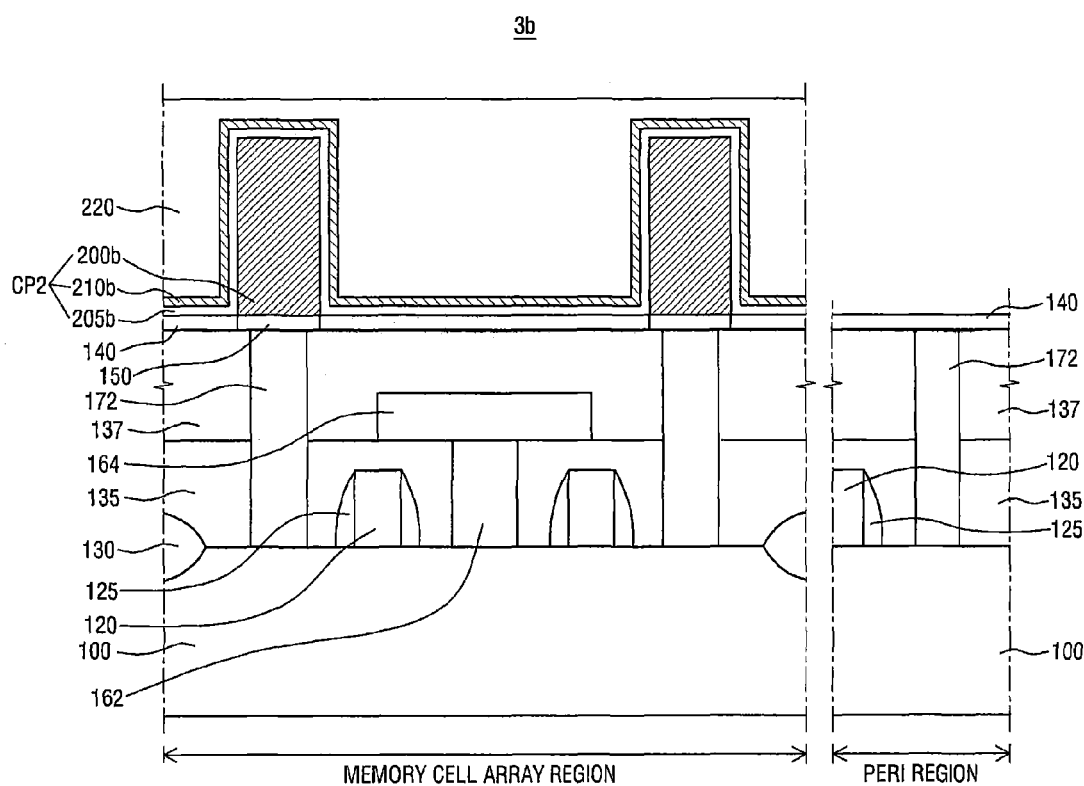
Figure 3C:
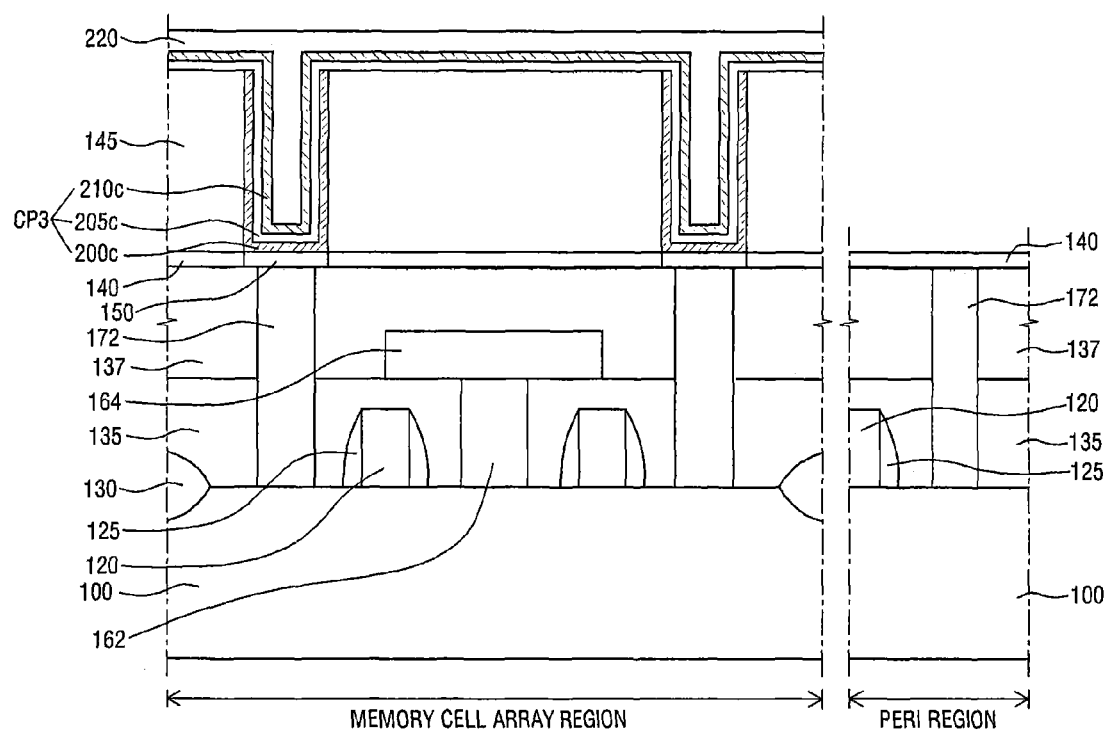

FIG. 1 is a diagram of a semiconductor device according to some embodiments of the present inventive concept. FIG. 2A is a layout of a portion of a memory cell array region, and FIG. 2B is a circuit diagram of a memory cell in the memory cell array region. FIGS. 3A, 3B and 3C are cross-sectional views taken along the line I-I' of FIG. 1 of a semiconductor device according to some embodiments of the present inventive concept.

Referring to FIG. 1, a semiconductor device according to some embodiments of the present inventive concept may be a DRAM, and a DRAM may include a memory cell array region and a peripheral (PERI) region.

The memory cell array region may be a region in which a data storing circuit is disposed, and the PERI region may be a region in which a circuit controlling writing/reading of data to and/or from the memory cell array region is disposed.

Referring to FIG. 2A, a unit active region 180 may be formed to extend in a first direction DR1 on a substrate 100, a gate electrode 120 that is electrically connected to a word line may be formed to extend in a second direction DR2, which forms an acute angle with respect to the first direction DR1, and a bit line 164 may be formed to extend in a third direction DR3, which forms an acute angle with respect to the first direction DR1.

It will be understood that in the phrase "a first direction and a second direction form a first angle," the first angle refers to a smaller angle of two angles formed by the first and second directions. For example, where the first and second directions intersect each other and form 120° and 60°, the first angle is 60°. Therefore, as shown in FIG. 2A, the angle formed by the first direction DR1 and the second direction DR2 is $\theta 1$, and the angle formed by the first direction DR1 and the third direction DR3 is $\theta 2$.

As described above, $\theta 1$ and/or $\theta 2$ may be acute angles to secure a distance between a bit line contact 162 connecting the unit active region 180 and the bit line 164 and a storage node contact 172 connecting the unit active region 180 and a capacitor (e.g., CP1 of FIG. 3A). For example, the second and third directions DR2 and DR3 may form a substantially right angle and $\theta 1$ may be 30°, 45° or 60°. Accordingly, $\theta 2$ may be 60°, 45° or 30°, respectively. However, aspects of the present inventive concept are not limited thereto.

Referring to FIG. 2B, the memory cell may include a bit line BL, a capacitor Cap and a switching transistor TR.

A gate of the switch transistor TR may be electrically connected to the word line WL, and source/drain nodes of the switch transistor TR may be electrically connected to the bit line BL and the capacitor Cap, respectively. In some embodiments, the capacitor Cap may be connected to a ground, and the switch transistor TR may be an N type transistor.

Referring to FIG. 3A, a semiconductor device 3a according to some embodiments of the present inventive concept may include a substrate 100, a first interlayer dielectric layer 135, a second interlayer dielectric layer 137, an etching stop layer 140, a noble metal 150, a first capacitor CP1, and a capping layer 220.

The substrate 100 may include a memory cell array region and a peripheral (PERI) region. In addition, a field oxide layer 130 for isolation between other elements and gate electrodes 120, which include a spacer 125, may be formed on the substrate 100.

The substrate 100 may be made of one or more semiconductor materials, for example, Si, Ge, SiGe, GaP, GaAs, SiC, SiGeC, InAs and/or InP. In some embodiments, the substrate 100 may be a silicon on insulator (SOI) substrate.

The first interlayer dielectric layer 135 may be formed on the substrate 100 including the gate electrodes 120. The bit line contact 162, passing through the first interlayer dielectric layer 135, may be formed between the gate electrodes 120. The bit line contact 162 may connect the substrate 100 and the bit line 164, and the bit line 164 that is connected to the substrate 100 through the bit line contact 162 may be formed on the first interlayer dielectric layer 135.

The second interlayer dielectric layer 137 may be formed on the first interlayer dielectric layer 135. The storage node contact 172, passing through the first and second interlayer dielectric layers 135 and 137, may be connected to the substrate 100. In some embodiments, the storage node contact 172 may include a stacked structure including a polysilicon plug, titanium nitride and a titanium barrier, but aspects of the present inventive concept are not limited thereto.

The etching stop layer 140 may be formed on the second interlayer dielectric layer 137 and the storage node contact 172. The etching stop layer 140 may prevent or reduce etching layers and/or regions disposed under the etching stop layer 140 when a mold layer (e.g., 145 of FIG. 7) is etched.

The etching stop layer 140 may include, for example, silicon nitride, but aspects of the present inventive concept are not limited thereto. The etching stop layer 140 may include a different material from the mold layer (e.g., 145 of FIG. 7) such that the etching stop layer 140 may have an etch selectivity with respect to the mold layer.

The noble metal 150 may be disposed on a bottom surface of the storage node hole (e.g., 153 of FIG. 11) and may be formed on the storage node contact 172. In some embodiments, the noble metal 150 may be disposed between the storage node contact 172 and a first electrode 200a.

It will be understood that the noble metal 150 may be used as a catalyst during etching the mold layer (e.g., 145 of FIG. 7) to form the storage node hole (e.g., 153 of FIG. 11), and the noble metal 150 may thus remain on a bottom surface of the storage node hole after etching the mold layer.

The noble metal 150 may include, for example, Ag, Au, Pt, Al, and/or Cu, but aspects of the present inventive concept are not limited thereto.

According to FIG. 3A, the first capacitor CP1 may include a one cylinder storage (OCS) type capacitor. The first capacitor CP1 may have a substantially uniform width along its depth. Accordingly, upper and lower portions of the first capacitor CP1 may have a substantially equivalent width.

The first capacitor CP1 may include a first electrode 200a, a dielectric layer 205a and a second electrode 210a.

The first electrode 200a may have a cylindrical shape and may be a lower electrode of the first capacitor CP1.

A bottom surface of the first electrode 200a may be higher than or at an equal height to a top surface of the etching stop layer 140 relative to an upper surface of the substrate 100 because the noble metal 150 may be disposed under the first electrode 200a.

The first electrode 200a may include, for example, a noble metal based material, a noble metal conductive oxide or a perovskite type conductive oxide. In some embodiments, the first electrode 200a may include Pt, Ru, Ir, PtO, $RuO_2$, $IrO_2$, $SrRuO_3$, $BaRuO_3$, $CaRuO_3$, or $(Ba, Sr)RuO_3$, and may be a single layered structure of these materials or a stacked layered structure including two or more layers of these materials.

In some embodiments, the first electrode 200a may include a refractory metal or a refractory metal nitride. The first electrode 200a may include, for example, Ti, TiN, W, WN, Ta, TaN, HfN, ZrN, TiAlN, TaSiN, TiSiN, or TaAlN and may be fabricated in a single layered structure of these materials or a stacked layered structure including two or more layers of these materials.

The first electrode 200a, formed on the noble metal 150, may include a different material from the noble metal 150. The first electrode 200a and the noble metal 150 may include different materials such that the first electrode 200a and the noble metal 150 may not physically and/or chemically affect each other.

The dielectric layer 205a may be formed on the first electrode 200a. In detail, the dielectric layer 205a may be formed on outer and inner sidewalls and the bottom surface of the cylindrical first electrode 200a and on the etching stop layer 140.

In some embodiments, the dielectric layer 205a may include a three or more component dielectric material having a perovskite structure. The dielectric layer 205a may include, for example, (Ba, Sr)TiO$_3$(BST), SrTiO$_3$, BaTiO$_3$, PZT, PLZT, (Ba, Sr)(Zr, Ti)O$_3$(BSZTO), Sr(Zr, Ti)O$_3$(SZTO), Ba(Zr, Ti)O$_3$(BZTO), (Ba, Sr)ZrO$_3$(BSZO), SrZrO$_3$, or BaZrO$_3$.

In some embodiments, the dielectric layer 205a may include a two component dielectric material and may include, for example, ZrO$_2$, HfO$_2$, Al$_2$O$_3$, Ta$_2$O$_5$, or TiO$_2$. The dielectric layer 205a may be formed of any one of these materials alone or any combination thereof.

The second electrode 210a may be included in an upper electrode of the first capacitor CP1.

The second electrode 210a may conformally cover the dielectric layer 205a, and the second electrode 210a and the dielectric layer 205a may thus have an equivalent profile.

In some embodiments, the second electrode 210a may include a noble metal based material having a high work function and may include, for example, Pt, Ru or Ir. It will be understood that since the second electrode 210a includes the noble metal based material, a work function difference between the second electrode 210a and the dielectric layer 205a may increase, thereby leakage current of the first capacitor CP1 may decrease.

In some embodiments, the second electrode 210a may include a noble metal conducting oxide or a perovskite type conductive oxide. The second electrode 210a may include, for example, PtO, RuO$_2$, IrO$_2$, SrRuO$_3$, BaRuO$_3$, CaRuO$_3$, or (Ba, Sr)RuO$_3$ and may be fabricated in a single layered structure of these materials or a stacked layered structure including two or more layers of these materials.

The capping layer 220 may be formed on the second electrode 210a and may suppress grain growth and/or agglomeration of the second electrode 210a.

The second electrode 210a including a noble metal based material may undergo grain growth and/or agglomeration by a thermal budget when a temperature about 350° C. or higher is applied to the second electrode 210a. It will be understood that grain growth of the second electrode 210a may cause physical damage to the dielectric layer 205a that contacts the second electrode 210a, thereby resulting in leakage current.

When a surface of the second electrode 210a is exposed, grain growth and/or agglomeration may be more activated or accelerated. Therefore, the capping layer 220 may be provided on the surface of the second electrode 210a, and grain growth of the second electrode 210a due to the thermal budget may be suppressed.

In order to suppress grain growth of the second electrode 210a, the capping layer 220 may be deposited at a low temperature, in a range of about 10° C. to about 300° C. or less. The capping layer 220 may include a material having good step coverage to cover an entire top surface of the second electrode 210. In addition, the capping layer 220 may include oxide so as to suppress deformation due to stress of the capping layer 220 itself.

The capping layer 220 may include, for example, ZrO$_2$, Al$_2$O$_3$, HfO$_2$, LaAlO$_3$, BaZrO$_3$, SrZrO$_3$, BST, SrTiO$_3$, BaTiO$_3$, TiO$_2$, or SiO$_2$ and which may be fabricated in a single layered structure of these materials or a stacked layered structure including two or more layers of these materials.

Figure 7:
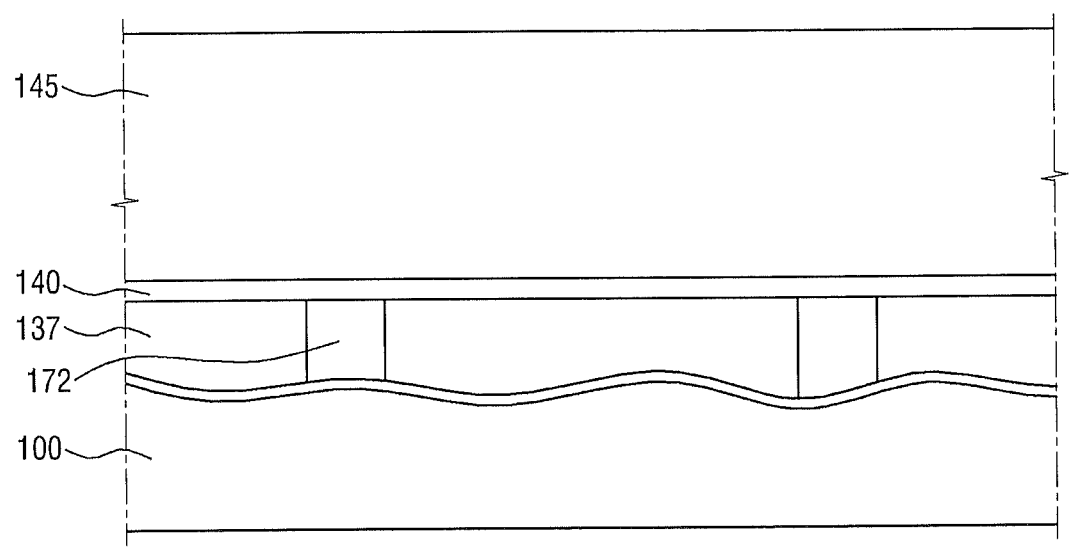

The semiconductor device 3a according to the some embodiments of the present inventive concept may include the first capacitor CP1 having a substantially equivalent width in its upper and lower portions that may be formed using the noble metal 150 as a catalyst during etching the mold layer (e.g., 145 of FIG. 7). Stated in other words, the first capacitor CP1 may have a vertical, not slanted or inclined, sidewall. Etching the mold layer may be performing a wet etching process.

Since the storage node hole (e.g., 153 of FIG. 11) has a substantially equivalent width in its upper and lower portions, the storage node hole may have a high aspect ratio (i.e., a large depth) while maintaining a small foot print. It will be understood that as the depth of the storage node hole increases, a surface area of the first capacitor CP1 formed in the storage node hole may increase. Therefore, the first capacitor CP1 may have a high capacitance value.

It will be further understood that the dielectric layer 205a including a metal oxide and the first and second electrodes 200a and 210a including a metal may increase a work function difference between the dielectric layer 205a and the first and second electrodes 200a and 210a. Accordingly, a leakage current barrier may be formed, thereby reducing leakage current of the first capacitor CP1. In particular, if the second electrode 210a is formed using a noble metal based material having a high work function and high oxidation resistance, the leakage current may be reduced and an interface reaction due to oxidation may be reduced, thereby lowering the capacitance of the first capacitor CP1.

FIG. 3B is a cross-sectional view taken along the line of FIG. 1 of a semiconductor device according to some embodiments of the present inventive concept.

Referring to FIG. 3B, a semiconductor device 3b according to some embodiments of the present inventive concept may include a second capacitor CP2.

The second capacitor CP2 may be a pillar type capacitor. The second capacitor CP2 may be formed in the storage node hole (e.g., 153 of FIG. 11), which has a substantially equivalent width in upper and lower portions. Accordingly, upper and lower portions of the second capacitor CP2 may also have the substantially equivalent width.

The second capacitor CP2 may include a first electrode 200b, a dielectric layer 205b, and a second electrode 210b.

The first electrode 200b may have a pillar shape and may be a lower electrode of the second capacitor CP2. In some embodiments, a bottom surface of the first electrode 200b may be substantially coplanar with a top surface of an etching stop layer 140.

In some embodiments, the first electrode 200b in FIG. 3B may include a material that is included in the first electrode 200a in FIG. 3A. For example, the first electrode 200a and the first electrode 200b may include the same material.

The dielectric layer 205b may be formed on the first electrode 200b. The dielectric layer 205b may be formed to cover a top surface and a side surface of the first electrode 200b and a top surface of the etching stop layer 140.

In some embodiments, the dielectric layer 205b in FIG. 3B may include a material that is included in the dielectric layer 205a in FIG. 3A. For example, the dielectric layer 205a and the dielectric layer 205b may include the same material.

The second electrode 210b may be included in an upper electrode of the second capacitor CP2.

The second electrode 210b and the dielectric layer 205b may have a substantially the same or similar profile.

In some embodiments, the second electrode 210b in FIG. 3B may include a material that is included in the second electrode 210a FIG. 3A. For example, the second electrode 210a and the second electrode 210b may include the same material.

FIG. 3C is a cross-sectional view taken along the line I-I' of FIG. 1 of a semiconductor device according to some embodiments of the present inventive concept.

Referring to FIG. 3C, a semiconductor device 3c according to some embodiments of the present inventive concept may include a third capacitor CP3.

The third capacitor CP3 may be a concave capacitor. The third capacitor CP3 may be formed in the storage node hole (e.g., 153 of FIG. 11), which has a substantially equivalent width in upper and lower portions and upper and lower portions of the third capacitor CP3 may also have the substantially equivalent width.

The third capacitor CP3 may include a first electrode 200c, a dielectric layer 205c, and a second electrode 210c.

The first electrode 200c may have a concave shape and may be a lower electrode of the third capacitor CP3. A bottom surface of the first electrode 200c may be coplanar with a top surface of an etching stop layer 140.

In some embodiments, the first electrode 200c in FIG. 3C may include a material that is included in the first electrode 200a in FIG. 3A. For example, the first electrode 200a and the first electrode 200c may include the same material.

The dielectric layer 205c may be formed on the first electrode 200c. In detail, the dielectric layer 205c may be formed on an inner sidewall and the bottom surface of the first electrode 200c and on the mold layer 145.

In some embodiments, the dielectric layer 205c in FIG. 3C may include a material that is included in the dielectric layer 205a in FIG. 3A. For example, the dielectric layer 205a and the dielectric layer 205c may include the same material.

The second electrode 210c may be included in an upper electrode of the third capacitor CP3.

The second electrode 210c may conformally cover the dielectric layer 205c, and the second electrode 210c and the dielectric layer 205c may have substantially the same or similar profile.

In some embodiments, the second electrode 210c in FIG. 3C may include a material that is included in the second electrode 210a in FIG. 3A. For example, the second electrode 210a and the second electrode 210c may include the same material.

The semiconductor devices 3a, 3b and 3c according to some embodiments of the present inventive concept may include a memory cell array region and a peripheral (PERI) region. The PERI region may be formed concurrently with the memory cell array region up to the etching stop layer 140. In some embodiments, the PERI region may not include capacitors as illustrated in FIGS. 3A to 3C.

Figure 4A:
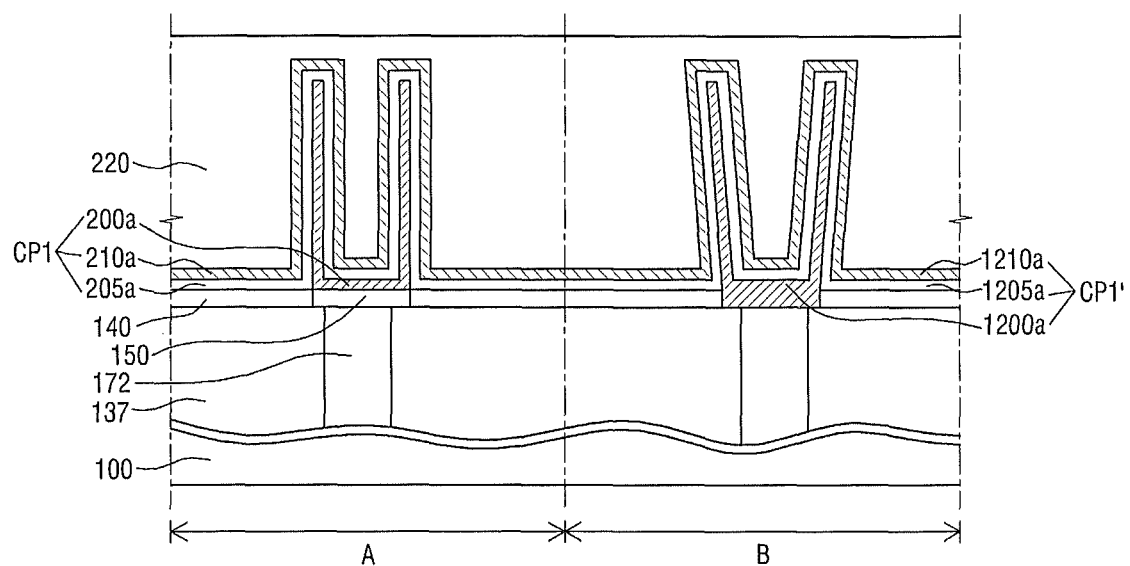
FIGS. 4A, 4B and 4C are cross-sectional views of a semiconductor device according to some embodiments of the present inventive concept.

FIG. 4A is a cross-sectional view of a semiconductor device according to some embodiments of the present inventive concept.

Referring to FIG. 4A, in a semiconductor device 4a according to the some embodiments of the present inventive concept, a substrate 100 may include a first region A and a second region B. In some embodiments, the first region A may be in the memory cell array region, and the second region B may be in the PERI region illustrated in FIG. 1.

The semiconductor device 4a may include a CMOS transistor. The first region A of the substrate 100 may include a PMOS transistor and/or an NMOS transistor, and the second region B of the substrate 100 may include a PMOS transistor and/or an NMOS transistor.

In the first region A of the substrate 100, a noble metal 150 may be disposed under a first electrode 200a and an OCS type capacitor CP1 may be formed. In the second region B of the substrate 100, a noble metal may not be disposed under a first electrode 1200a and an OCS type capacitor CP1' may be formed.

The first region A may include a storage node hole, having a substantially equivalent width in its upper and lower portions, which is formed by performing a wet etching process using the noble metal 150 as a catalyst. The second region B may include a storage node hole, having a first width in an upper portion of the storage node hole greater than a second width in lower portion of the storage node hole, which is formed by performing a dry etching.

Therefore, the first region A may include a capacitor CP1 having a substantially equivalent width in its upper and lower portions, and the second region B may include another capacitor CP1' having different widths in its upper and lower portions. The capacitor CP1' may further include a dielectric layer 1205a and a second electrode 1210a.

Figure 4B:
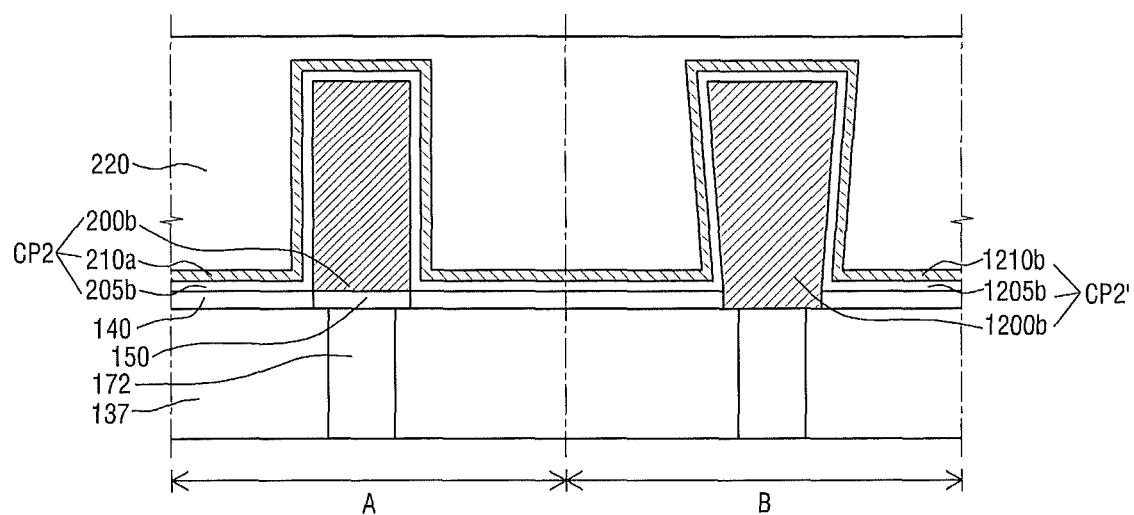

FIG. 4B is a cross-sectional view of a semiconductor device according to some embodiments of the present inventive concept.

Referring to FIG. 4B, in a semiconductor device 4b according to the some embodiments of the present inventive concept, a substrate 100 may include a first region A and a second region B.

In the first region A of the substrate 100, a noble metal 150 may be disposed under a first electrode 200b and a pillar type capacitor may be formed. In the second region B of the substrate 100, a noble metal may not be disposed under a first electrode 1200b and a pillar type capacitor may be formed.

The first region A may include a capacitor CP2 having a substantially equivalent width in its upper and lower portions, and the second region B may include another capacitor CP2' having different widths in its upper and lower portions. The capacitor CP2' may further include a dielectric layer 1205b and a second electrode 1210b.

Figure 4C:
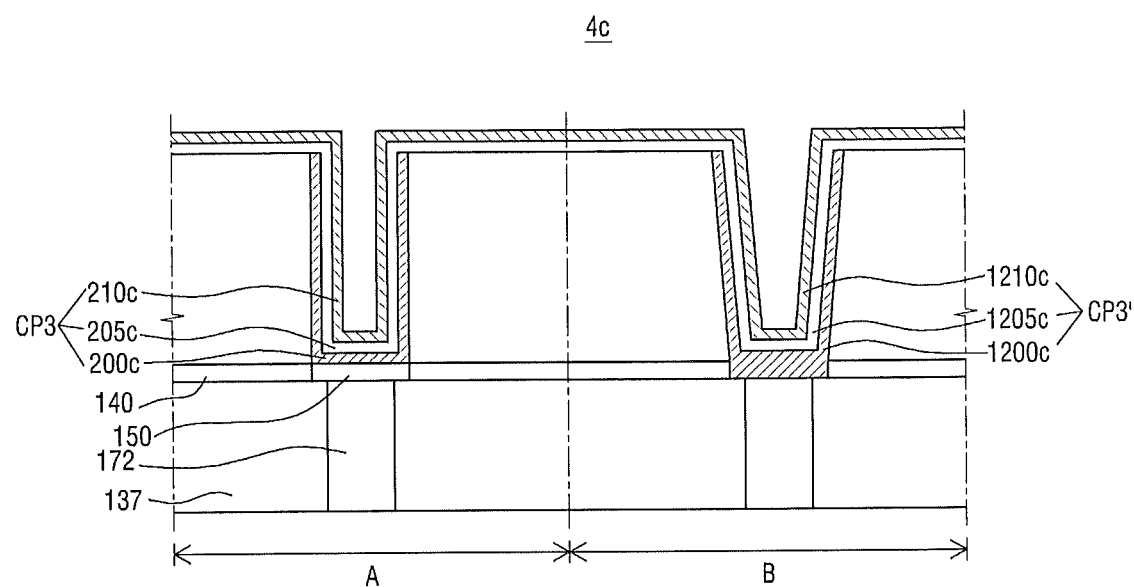

FIG. 4C is a cross-sectional view of a semiconductor device according to some embodiments of the present inventive concept.

Referring to FIG. 4C, in the semiconductor device 4c according to the some embodiments of the present inventive concept, a substrate 100 may include a first region A and a second region B.

In the first region A of the substrate 100, a noble metal 150 may be disposed under a first electrode 200c and a concave capacitor CP3 may be formed. In the second region B of the substrate 100, a noble metal may not be disposed under a first electrode 1200c and a concave capacitor CP3' may be formed.

The first region A may include a capacitor CP3 having a substantially equivalent width in its upper and lower portions, and the second region B may include another capacitor CP3' having different widths in its upper and lower portions. The capacitor CP3' may further include a dielectric layer 1205c and a second electrode 1210c.

FIGS. 5 to 12 are cross-sectional views illustrating intermediate structures provided in a method of fabricating a semiconductor device according to some embodiments of the present inventive concept.

Figure 5:
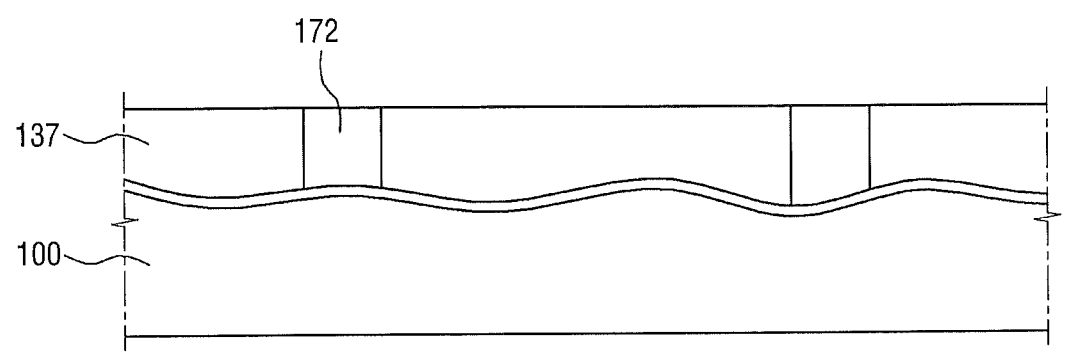
FIGS. 5 to 12 are cross-sectional views illustrating intermediate structures provided in a method of fabricating a semiconductor device according to some embodiments of the present inventive concept.

Referring to FIG. 5, a contact hole is formed by etching a portion of a second interlayer dielectric layer 137 formed on a substrate 100. After forming the contact hole, a conductive material may fill the contact hole, and planarization may be performed to expose a top surface of the second interlayer dielectric layer 137, thereby forming a storage node contact 172.

It will be understood that various elements formed under the etching stop layer 140 are not shown in FIG. 5 for easy of illustration.

Figure 6:
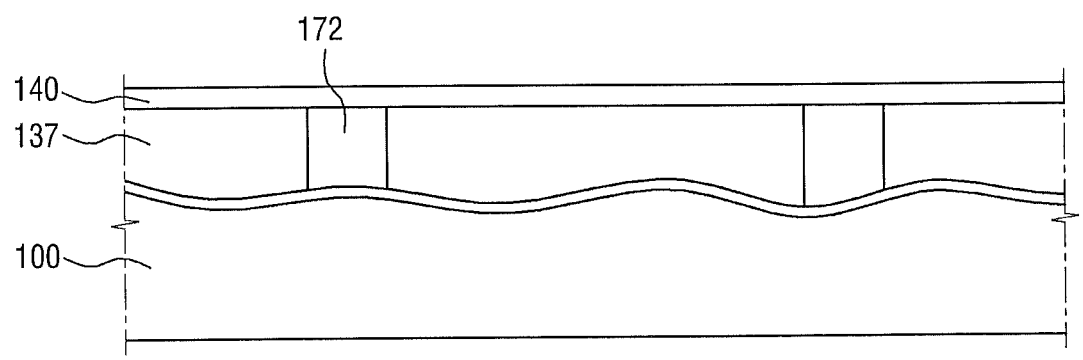

Referring to FIG. 6, the etching stop layer 140 may be formed on the second interlayer dielectric layer 137.

The etching stop layer 140 may include, for example, silicon nitride, but aspects of the present inventive concept are not limited thereto. For example, the etching stop layer 140 may be formed by depositing silicon nitride using a chemical vapor deposition (CVD) process.

Referring to FIG. 7, a mold layer 145 may be formed on the etching stop layer 140.

The mold layer 145 may be a layer provided for subsequently forming a lower electrode of a capacitor. Therefore, the mold layer 145 may be formed to have a height substantially the same as or similar to a height of the lower electrode or a height greater than that of the lower electrode.

The mold layer 145 may include, for example, polysilicon, but aspects of the present inventive concept are not limited thereto. The mold layer 145 may be made of a material having a high etch selectivity with respect to the etching stop layer 140. In addition, the mold layer 145 may be made of a material that can be easily removed by a wet etching process using a noble metal as a catalyst.

Figure 8:
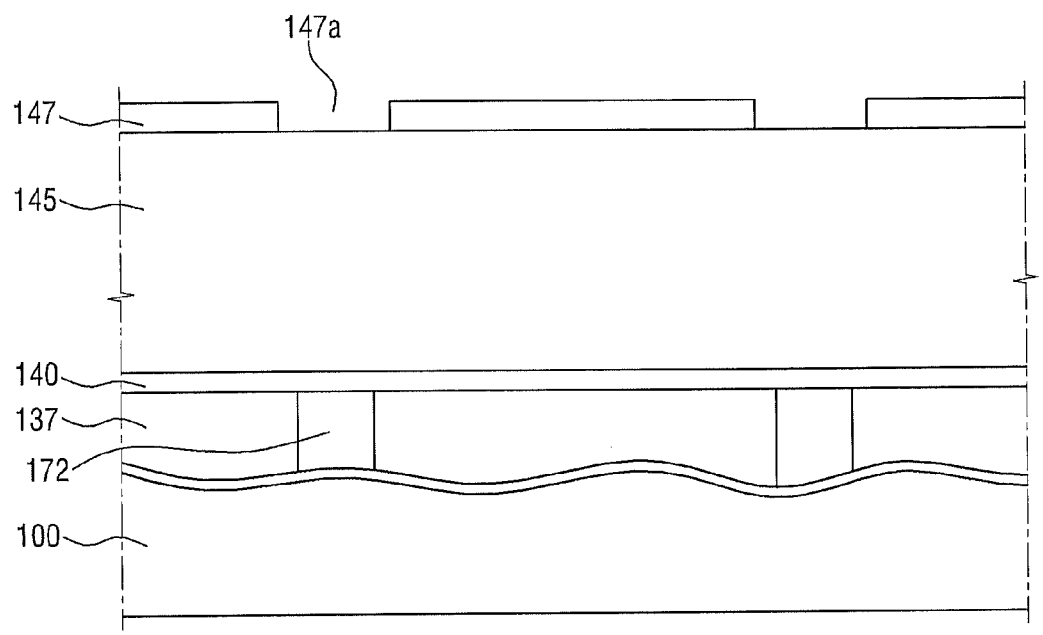

Referring to FIG. 8, a mask pattern 147 may be formed on the mold layer 145. The mask pattern 147 may include a recess 147a therein, which exposes the mold layer 145 as illustrated in FIG. 8.

The mask pattern 147 may serve as a mask during etching the mold layer 145, which will later be described, and a width of the recess 147a in the mask pattern 147 may be substantially the same as or similar to a width of the storage node hole (e.g., 153 of FIG. 11), which is formed subsequently.

Figure 9:
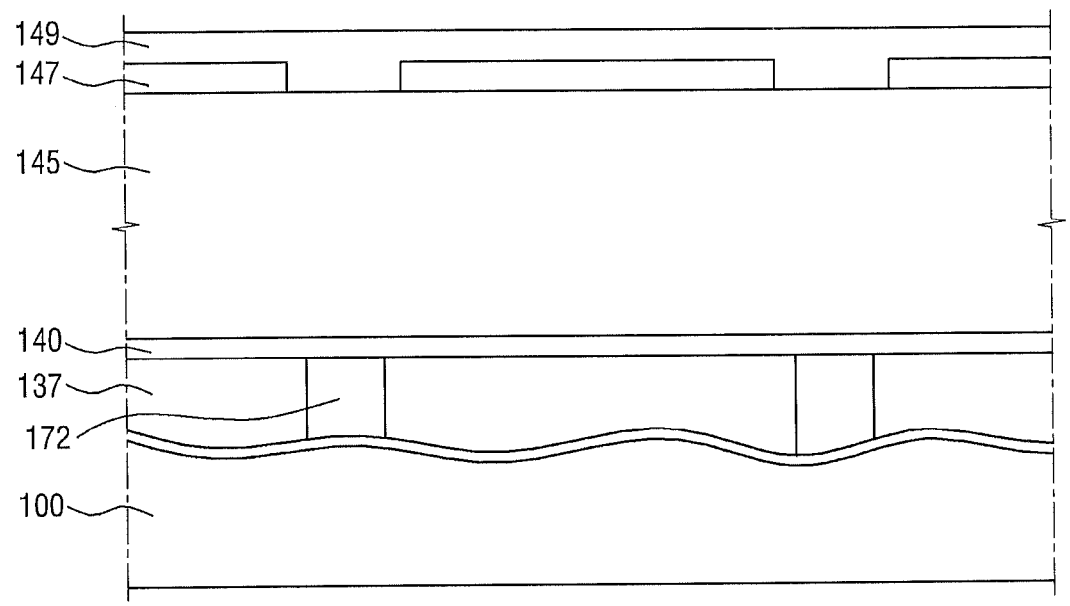
Figure 10:
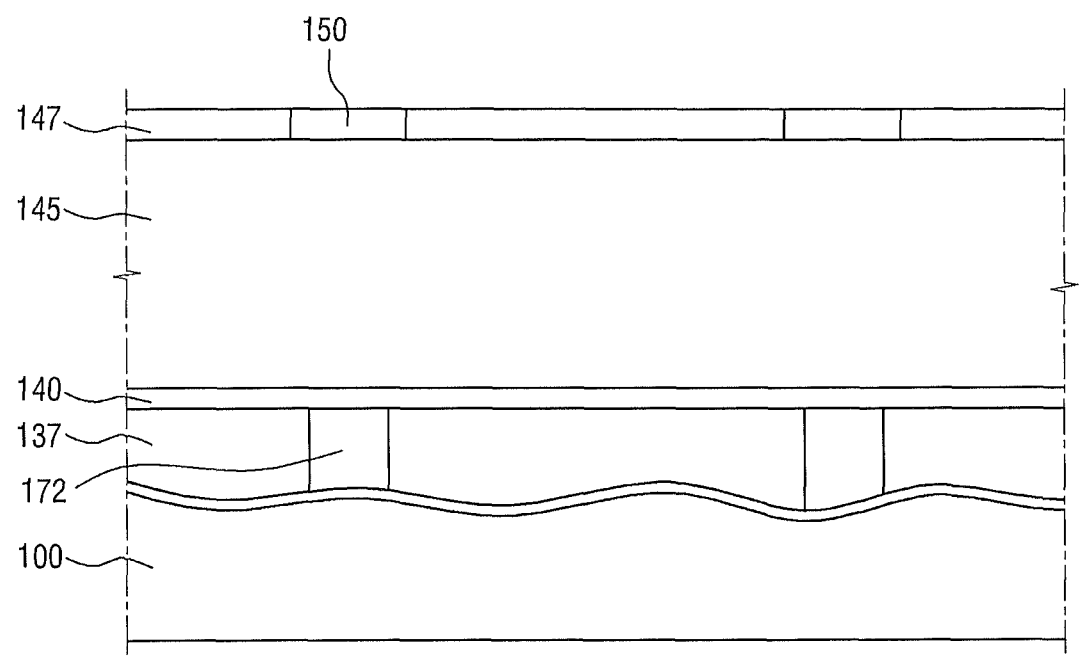

Referring to FIGS. 9 and 10, a noble metal layer 149 may be formed to cover the mask pattern 147 including the recess 147a and the mold layer 145. The noble metal layer 149 may fill the recess 147a in the mold layer 145.

The noble metal layer 149 may include, for example, Ag, Au, Pt, Al, and/or Cu, but aspects of the present inventive concept are not limited thereto.

After forming the noble metal layer 149, portions of the noble metal layer 149 may be removed (e.g., planarized) until a top surface of the mask pattern 147 is exposed. The planarizing may include, for example, performing a chemical mechanical polishing (CMP) process, but aspects of the present inventive concept are not limited thereto.

After removing the portions of the noble metal layer 149, a noble metal 150 may be formed in the recess 147a in the mask pattern 147. The noble metal 150 may laterally overlap with the storage node contact 137.

Figure 11:
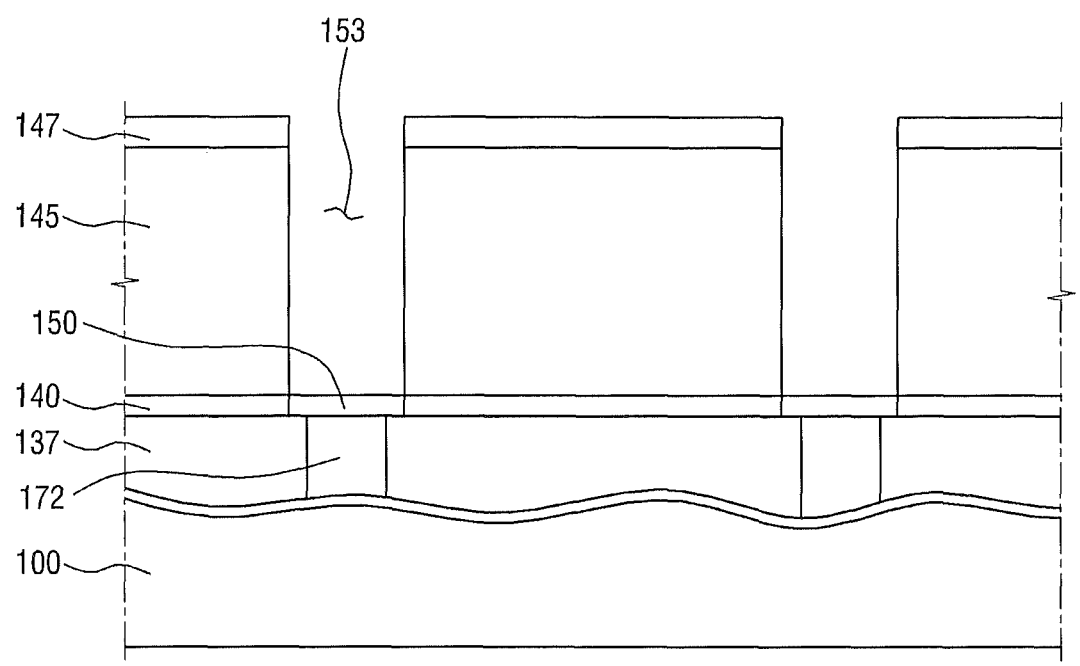
Figure 12:
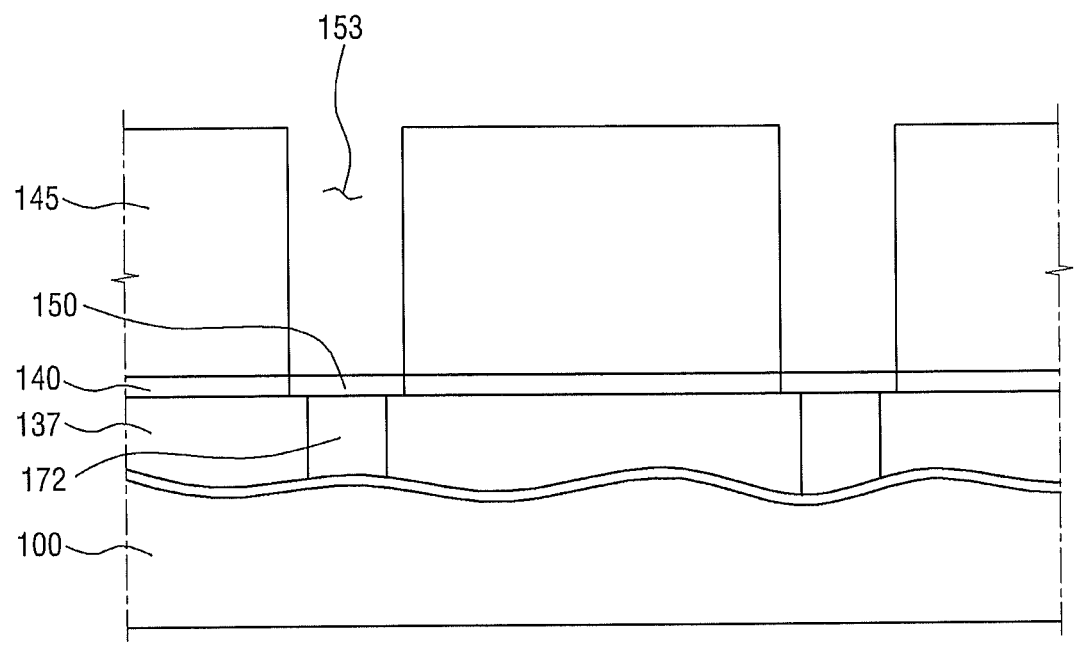

Referring to FIGS. 11 and 12, the mold layer 145 may be etched using the mask pattern 147 as an etch mask.

In detail, the mold layer 145 may be etched by a wet etching process using an etchant including $H_2O_2$/HF, HCl, $H_3PO_4$ or $H_2SO_4$. The noble metal 150 may be used as a catalyst during the wet etching process. It will be understood that the mold layer 145 may be etched along a direction that the noble metal 150 moves during the wet etching process. Thus, the noble metal 150 may laterally overlap with the storage node contact 137 after the wet etching process.

It will be further understood that a storage node hole 153 may have a substantially equivalent width in upper and lower portions thereof and may laterally overlap with the storage node contact 137 since the mold layer 145 is wet etched using the noble metal 150 as a catalyst. In addition, when the mold layer 145 is wet etched, a portion of the etching stop layer 140 may also be etched. The noble metal 150 remaining on a bottom surface of the storage node hole 153 may be disposed higher than or at an equal height to the etching stop layer 140 relative to the upper surface of the substrate 100.

According to FIG. 12, after forming the storage node hole 153, the mask pattern 147 may be removed.

In some embodiments, the noble metal 150 may be removed after forming the storage node hole 153. It will be understood that the noble metal 150 may remain after forming the storage node hole 153, FIGS. 13A to 13F are cross-sectional views illustrating intermediate structures provided in a method of fabricating a semiconductor device including a one cylinder storage (OCS) type capacitor according to some embodiments of the present inventive concept.

Figure 13A:
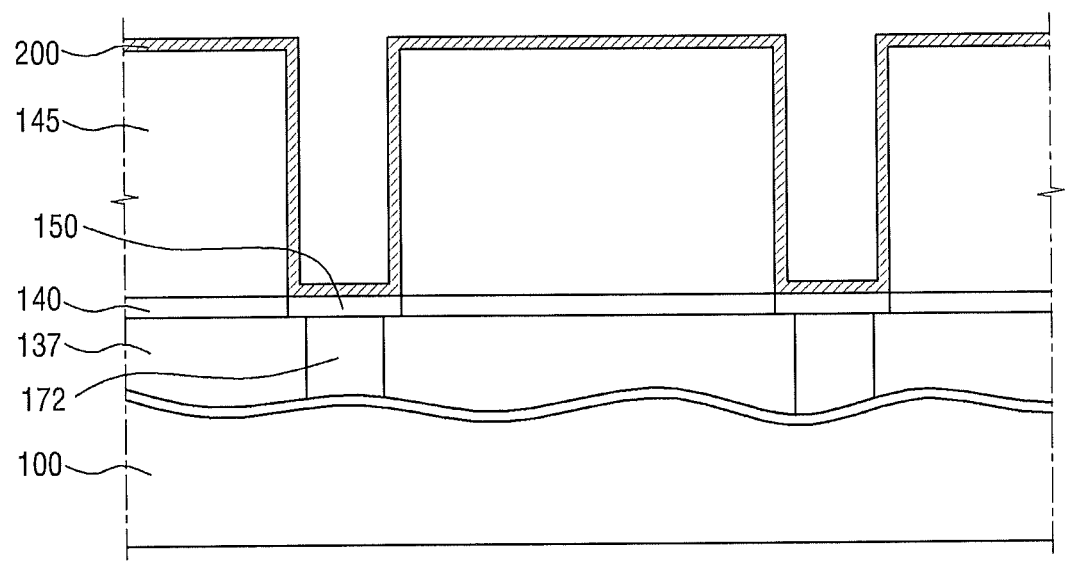
FIGS. 13A to 13F are cross-sectional views illustrating intermediate structures provided in a method of fabricating a semiconductor device including a one cylinder storage (OCS) type capacitor according to some embodiments of the present inventive concept.

Referring to FIG. 13A, a first conductive layer 200 may be formed on a sidewall and a bottom surface of the storage node hole 153 and a top surface of the mold layer 145.

The first conductive layer 200 may conformally cover the sidewalls and the bottom surface of the storage node hole 153 and the top surface of the mold layer 145. The first conductive layer 200 may formed on the sidewalls and the bottom surface of the storage node hole 153 while not filling the storage node hole 153.

For example, the first conductive layer 200 may include a metal, and examples may include a noble metal based material, a noble metal conducting oxide, and a perovskite type conductive oxide, but aspects of the present inventive concept are not limited thereto. The first conductive layer 200 may include, for example, Pt, Ru, Ir, PtO, $RuO_2$, $IrO_2$, $SrRuO_3$, $BaRuO_3$, $CaRuO_3$, or $(Ba, Sr)RuO_3$, and may be fabricated in a single layered structure of these materials or a stacked layered structure including two or more layers of these materials.

In some embodiments, the first conductive layer 200 may include a refractory metal or a refractory metal nitride. The first conductive layer 200 may include, for example, Ti, TiN, W, WN, Ta, TaN, HfN, ZrN, TiAlN, TaSiN, TiSiN, or TaAlN, which may be fabricated in a single layered structure of these materials or a stacked layered structure including two or more layers of these materials.

The first conductive layer 200 may be formed by an atomic layer deposition (ALD) process, a chemical vapor deposition (CVD) process or a physical vapor deposition (PVD) process. In some embodiments, the first conductive layer 200 may be formed by an ALD process to have good step coverage.

Figure 13B:
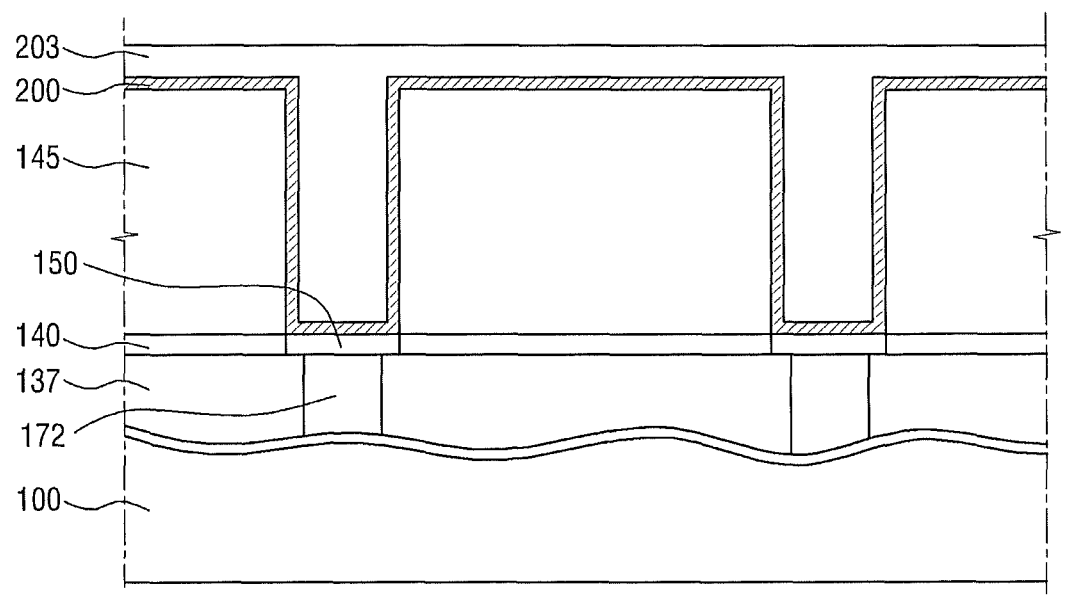
Figure 13C:
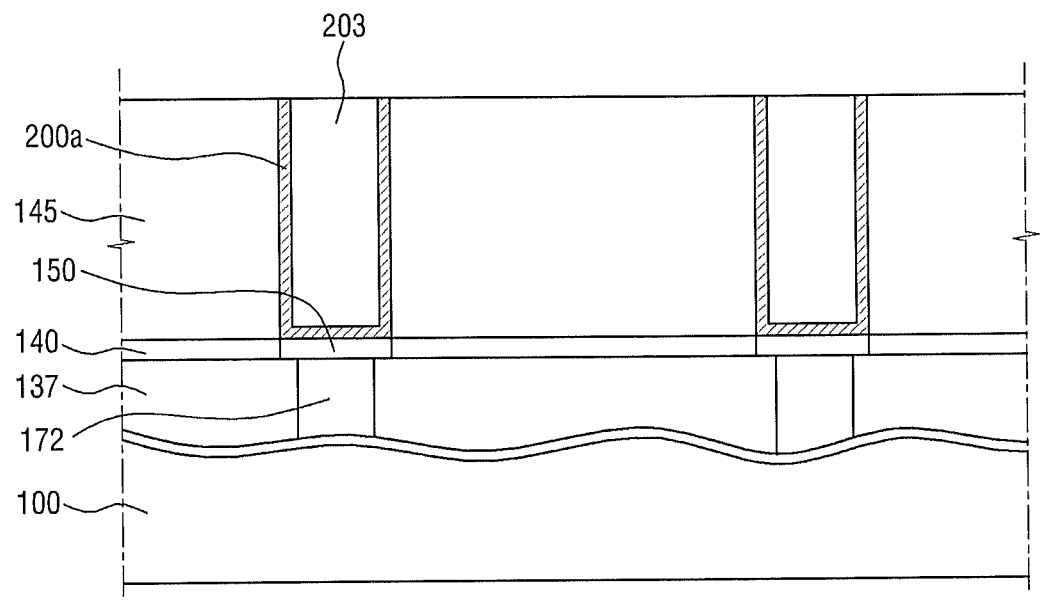

Referring to FIGS. 13B and 13C, a sacrificial layer 203 filling the storage node hole 153 may be formed on the first conductive layer 200.

The sacrificial layer 203 may be made of a material having properties substantially the same as or similar to those of the mold layer 145, but aspects of the present inventive concept are not limited thereto.

After forming the sacrificial layer 203, the sacrificial layer 203 and the first conductive layer 200 may be planarized until a top surface of the mold layer 145 is exposed. The planarizing may include, for example, a CMP process, but aspects of the present inventive concept are not limited thereto.

After planarizing the sacrificial layer 203 and the first conductive layer 200, the cylindrical first electrode 200a may be formed. The cylindrical first electrode 200a may serve as a lower electrode of the OCS type capacitor.

After the first electrode 200a is formed, annealing of the first electrode 200a may further be performed.

The annealing may allow grains of the first electrode 200a to sufficiently grow before forming a dielectric layer (e.g., 205a of FIG. 13E) on the first electrode 200a. It will be understood that after forming of the dielectric layer (e.g., 205a of FIG. 13E), grain growth of the first electrode 200a may not occur, and grain growth of the first electrode 200a may changes characteristics of the dielectric layer.

Figure 13D:
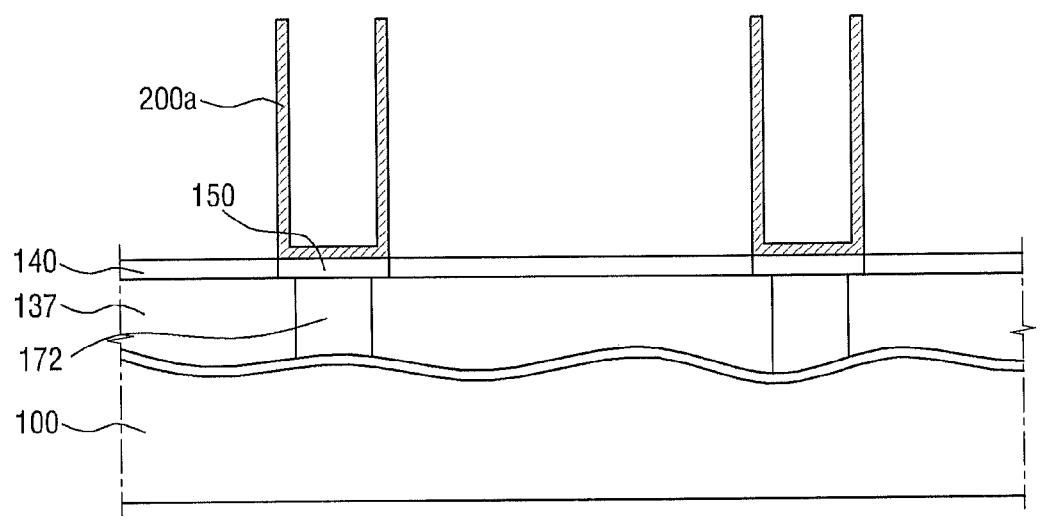

Referring to FIG. 13D, the mold layer 145 and the sacrificial layer 203 may be removed.

The mold layer 145 and the sacrificial layer 203 may be removed by performing a wet etching process in which plasma based attacks are not generated to reduce damages on the cylindrical first electrode 200a during removing the mold layer 145 and the sacrificial layer 203.

After removing the mold layer 145 and the sacrificial layer 203, outer and inner sidewalls of the cylindrical first electrode 200a may be exposed.

Figure 13E:
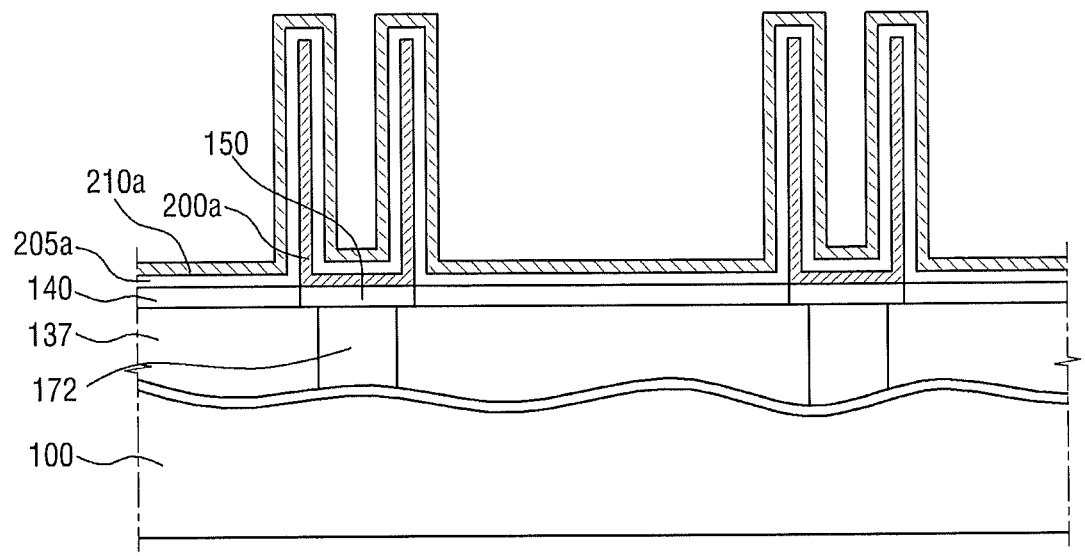

Referring to FIG. 13E, two or more component based dielectric materials including metal oxide may be deposited on the first electrode 200a and the etching stop layer 140 to form a dielectric layer 205a. The dielectric layer 205a may have a dielectric constant higher than that of an ONO layer.

The dielectric layer 205a may be formed by, for example, ALD, CVD or PVD. In some embodiments, the dielectric layer 205a may be formed by ALD to have good step coverage.

After forming the dielectric layer 205a, a material including a metal may be deposited on the dielectric layer 205a to form a second electrode 210a.

The second electrode 210a may be formed along a surface of the dielectric layer 205a and may not fill a space defined by an inner sidewall of the first electrode 200a.

The second electrode 210a may be formed by, for example, ALD, CVD or PVD. In some embodiments, the second electrode 210a may be formed by ALD to have good step coverage.

Figure 13F:
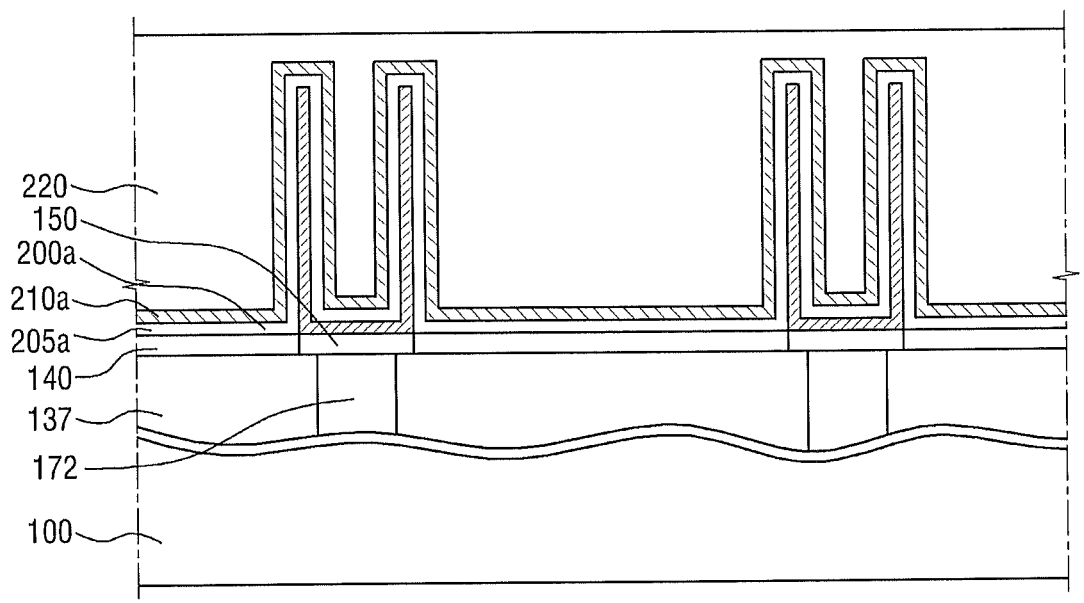

Referring to FIG. 13F, a capping layer 220 covering the second electrode 210a may be formed.

The capping layer 220 may be formed on the second electrode 210a for the purpose of suppressing grain growth and agglomeration of the second electrode 210a. In detail, if a thickness of the capping layer 220 is smaller than about 5 Å, it may be difficult to suppress grain growth of the second electrode 210a. If the thickness of the capping layer 220 is greater than about 3000 Å, it may be difficult to perform a deposition process. Therefore, the capping layer 220 may be formed to have a thickness in a range of about 5 Å to 3000 Å, but aspects of the present inventive concept are not limited thereto. In addition, in order to effectively suppress grain growth of the second electrode 210a using the capping layer 220, the capping layer 220 may be formed to fill the space defined by the inner sidewall of the cylindrical first electrode 200a.

The capping layer 220 may be formed by, for example, ALD, CVD, PVD or a spin-on-glass (SOG) process. In some embodiments, the capping layer 220 may be formed by ALD to have good step coverage.

FIGS. 14A to 14E are cross-sectional views illustrating intermediate structures provided in a method of fabricating a semiconductor device including a pillar type capacitor according to some embodiments of the present inventive concept.

Figure 14A:
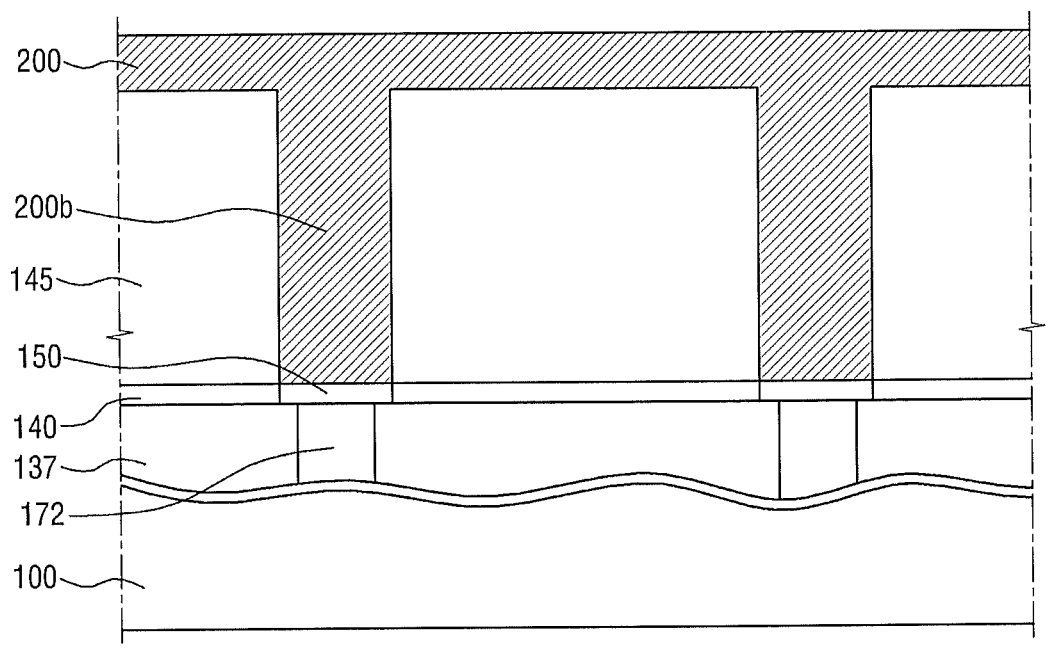
FIGS. 14A to 14E are cross-sectional views illustrating intermediate structures provided in a method of fabricating a semiconductor device including a pillar type capacitor according to some embodiments of the present inventive concept.
Figure 14B:
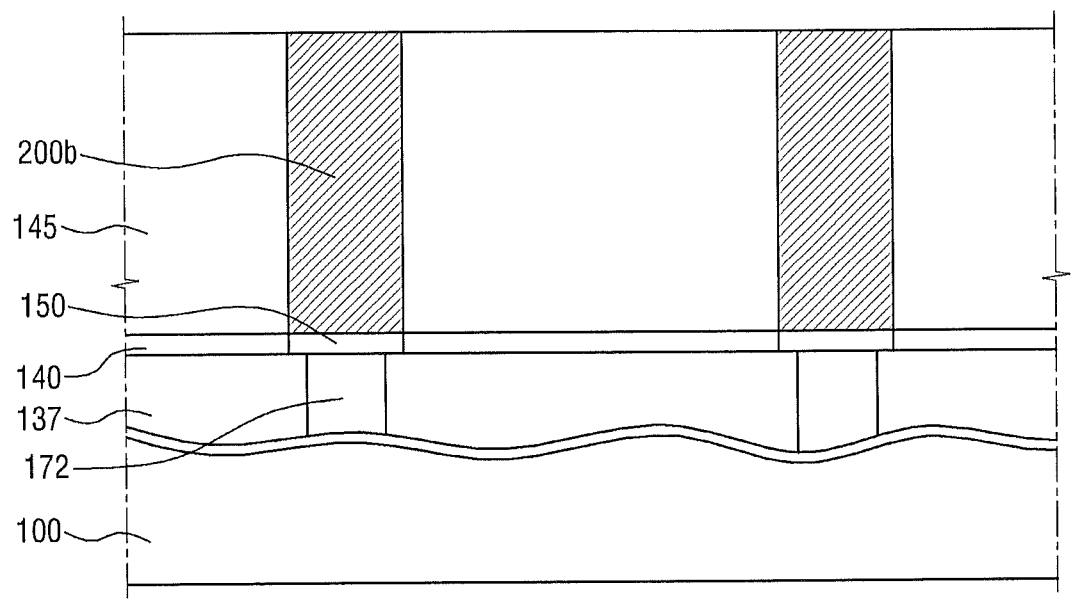

Referring to FIGS. 14A and 14B, a first conductive layer 200 may be formed to fill the storage node hole (e.g., 153 of FIG. 12). In some embodiments, the first conductive layer 200 may completely fill the storage node hole.

The first conductive layer 200 may be formed by, for example, ALD, CVD or PVD. In some embodiments, the first conductive layer 200 may be formed by ALD to have good step coverage.

After forming the first conductive layer 200, a planarization process may be performed to expose a top surface of the mold layer 145. The planarization process may include, for example, chemical mechanical polishing (CMP), but aspects of the present inventive concept are not limited thereto.

After planarizing the first conductive layer 200, a pillar type first electrode 200b may be formed from the first conductive layer 200.

Figure 14C:
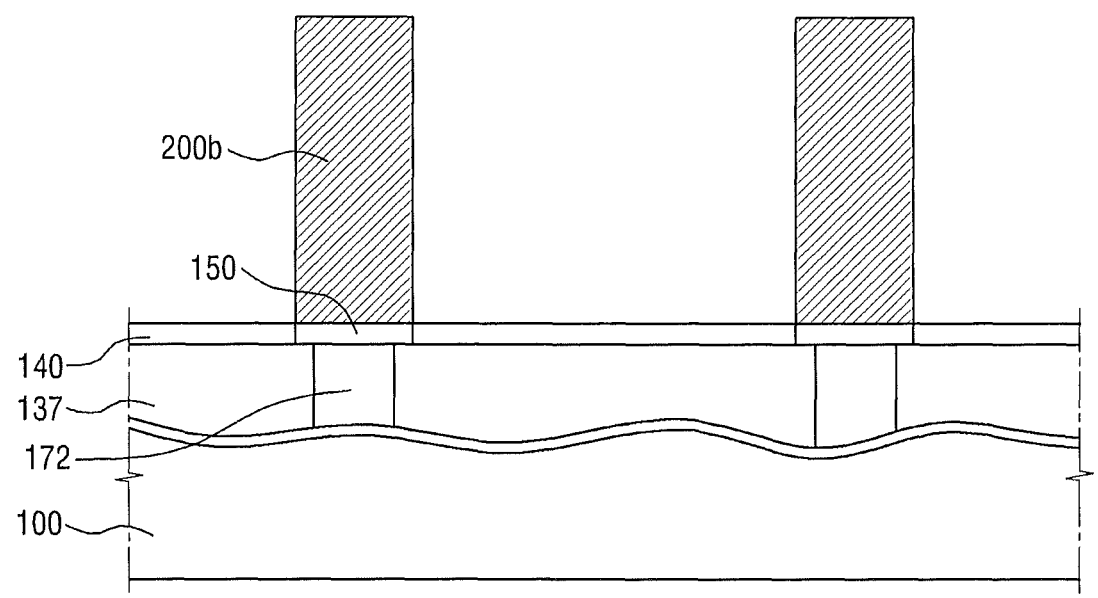

Referring to FIG. 14C, the mold layer 145 may be removed.

Removing the mold layer 145 may be performed by a wet etching process in which plasma based attacks are not generated to reduce damage on the first electrode 200b during removing of the mold layer 145.

After removing the mold layer 145, a sidewall and a top surface of the pillar type first electrode 200b may be exposed.

Figure 14D:
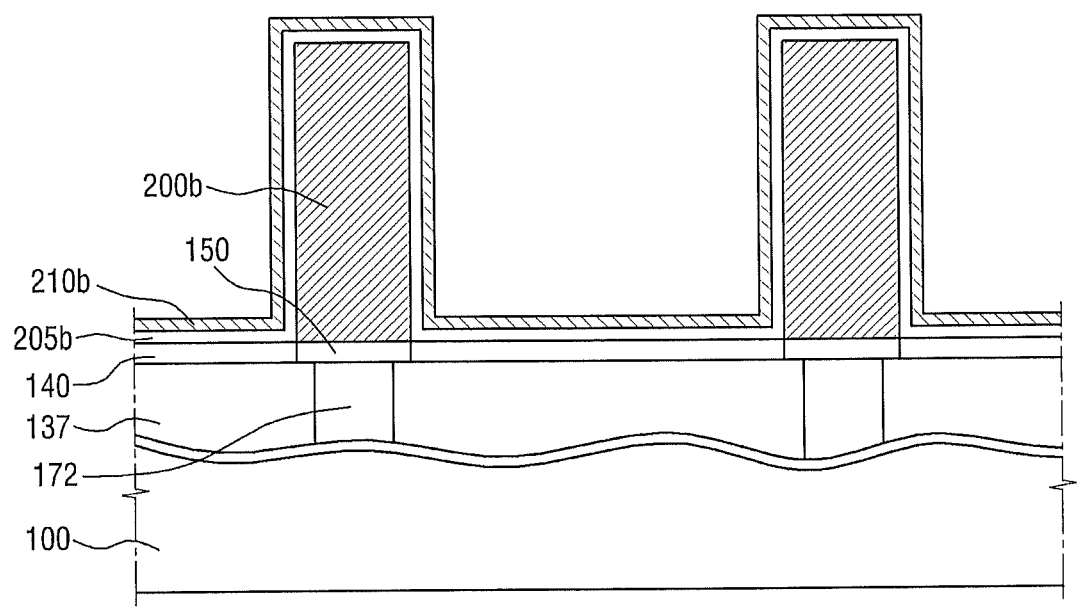

Referring to FIG. 14D, a dielectric layer 205b may be formed to cover the sidewall and the top surface of the first electrode 200b and a top surface of the etching stop layer 140.

The dielectric layer 205b may be formed by, for example, ALD, CVD or PVD. In some embodiments, the dielectric layer 205b may be formed by ALD to have good step coverage.

After forming the dielectric layer 205b, a material including a metal may be deposited on the dielectric layer 205b to form a second electrode 210b.

As illustrated, the second electrode 210b may be formed along a surface of the dielectric layer 205b and may not fill a space between two adjacent first electrodes 200b as illustrated in FIG. 14D.

The second electrode 210b may be formed by, for example, ALD, CVD or PVD. In some embodiments, the second electrode 210b may be formed by ALD to have good step coverage.

Figure 14E:
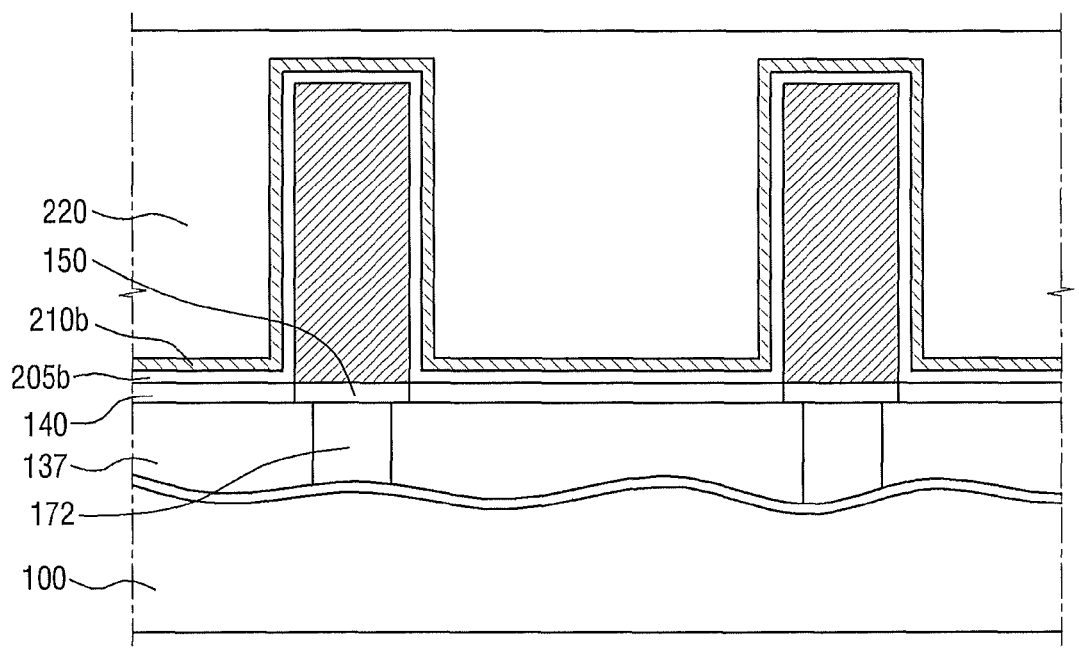

Referring to FIG. 14E, a capping layer 220 covering the second electrode 210b may be formed.

The capping layer 220 may be formed on the second electrode 210b for the purpose of suppressing grain growth and agglomeration of the second electrode 210b and may be formed by ALD, CVD or PVD. In some embodiments, the capping layer 220 may be formed by ALD to have good step coverage.

FIGS. 15A to 15D are cross-sectional views illustrating intermediate structures provided in a method of fabricating a semiconductor device including a concave capacitor according to some embodiments of the present inventive concept.

Figure 15A:
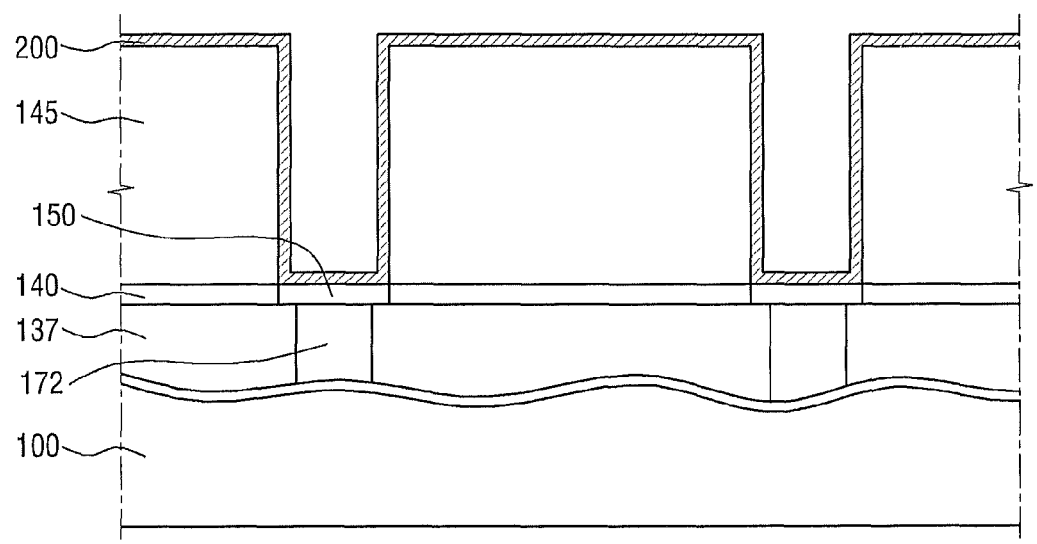
FIGS. 15A to 15D are cross-sectional views illustrating intermediate structures provided in a method of fabricating a semiconductor device including a concave capacitor according to some embodiments of the present inventive concept.

Referring to FIG. 15A, a first conductive layer 200 may be formed along a sidewall and a bottom surface of the storage node hole (e.g., 153 of FIG. 12) and a top surface of the mold layer 145.

The first conductive layer 200 may be formed by, for example, ALD, CVD or PVD. In some embodiments, the first conductive layer 200 may be formed by ALD to have good step coverage.

Figure 15B:
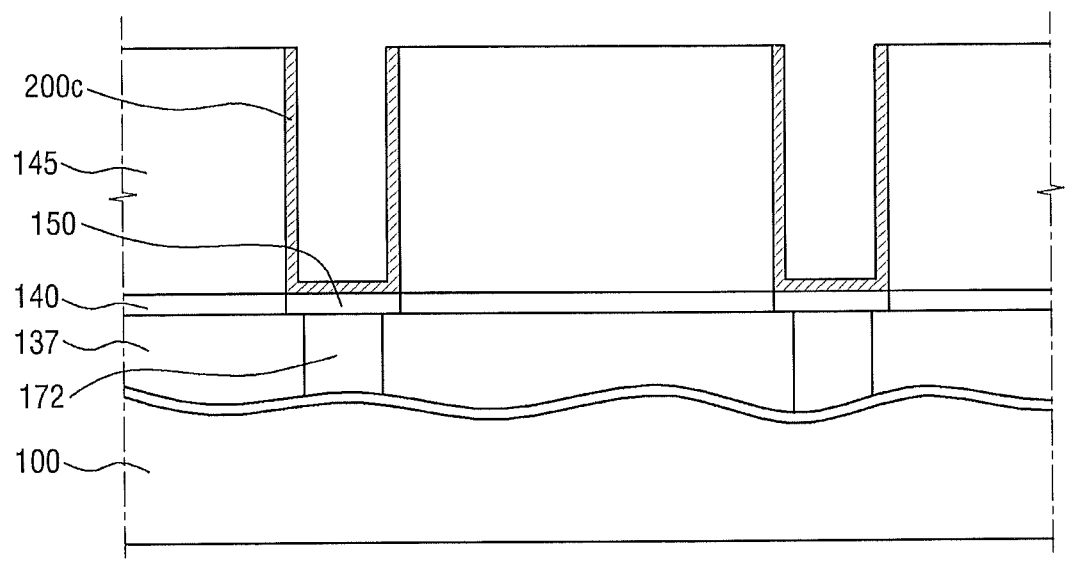

Referring to FIG. 15B, the first conductive layer 200 may be selectively removed to form the concave first electrode 200c formed along an inner sidewall and a bottom surface of the storage node hole (153 of FIG. 12).

Removing the first conductive layer 200 formed on the top surface of the mold layer 145 may be performed by photolithography. Alternatively, the first conductive layer 200 may be blanket-etched while adjusting processing conditions so as not to completely remove the first conductive layer 200 formed on the bottom surface of the storage node hole (153 of FIG. 12), thereby forming the first electrode 200c.

Figure 15C:
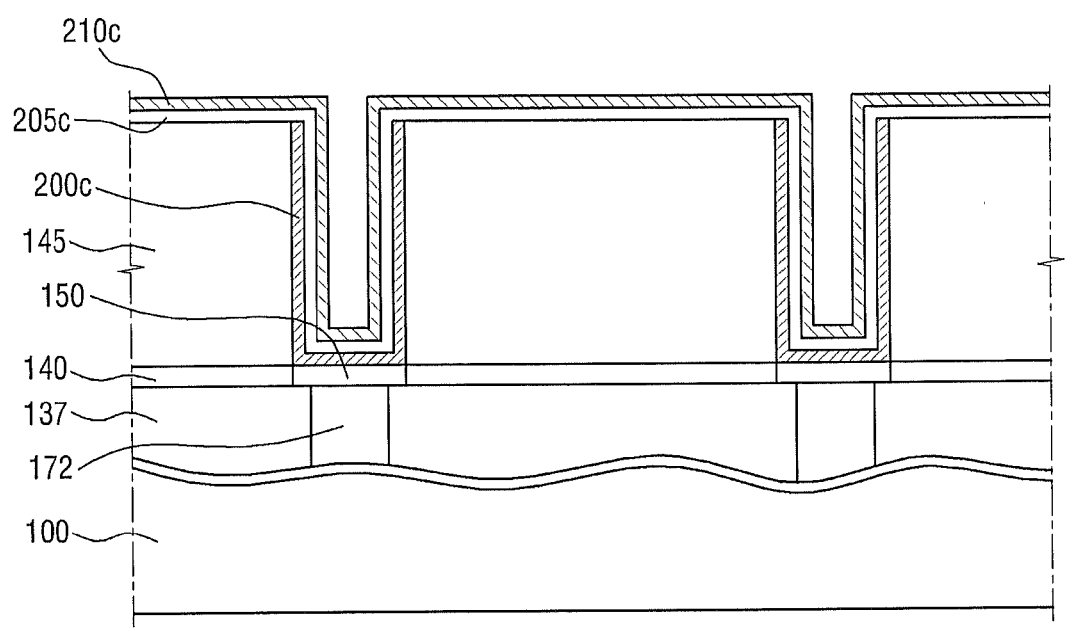

Referring to FIG. 15C, a dielectric layer 205c may be formed on the first electrode 200c and the mold layer 145.

The dielectric layer 205c may be formed by, for example, ALD, CVD or PVD. In some embodiments, the dielectric layer 205c may be formed by ALD to have good step coverage.

After forming the dielectric layer 205c, a material including a metal may be deposited on the dielectric layer 205c to form a second electrode 210c.

The second electrode 210c may be formed along a surface of the dielectric layer 205c and may not completely fill a space defined by the inner sidewall of the first electrode 200c.

The second electrode 210c may be formed by, for example, ALD, CVD or PVD. In some embodiments, the second electrode 210c may be formed by ALD to have good step coverage.

Figure 15D:
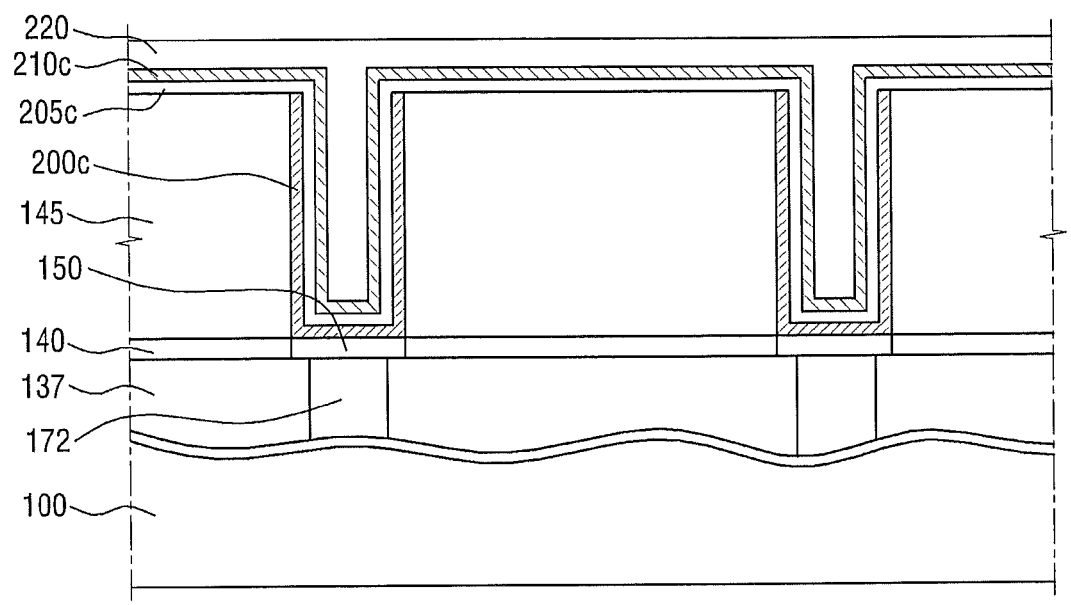

Referring to FIG. 15D, a capping layer 220 covering the second electrode 210c may be formed.

The capping layer 220 may be formed on the second electrode 210c for the purpose of suppressing grain growth and agglomeration of the second electrode 210c and may be formed by, for example, ALD, CVD or PVD. In some embodiments, the capping layer 220 may be formed by ALD to have good step coverage.

Figure 16:
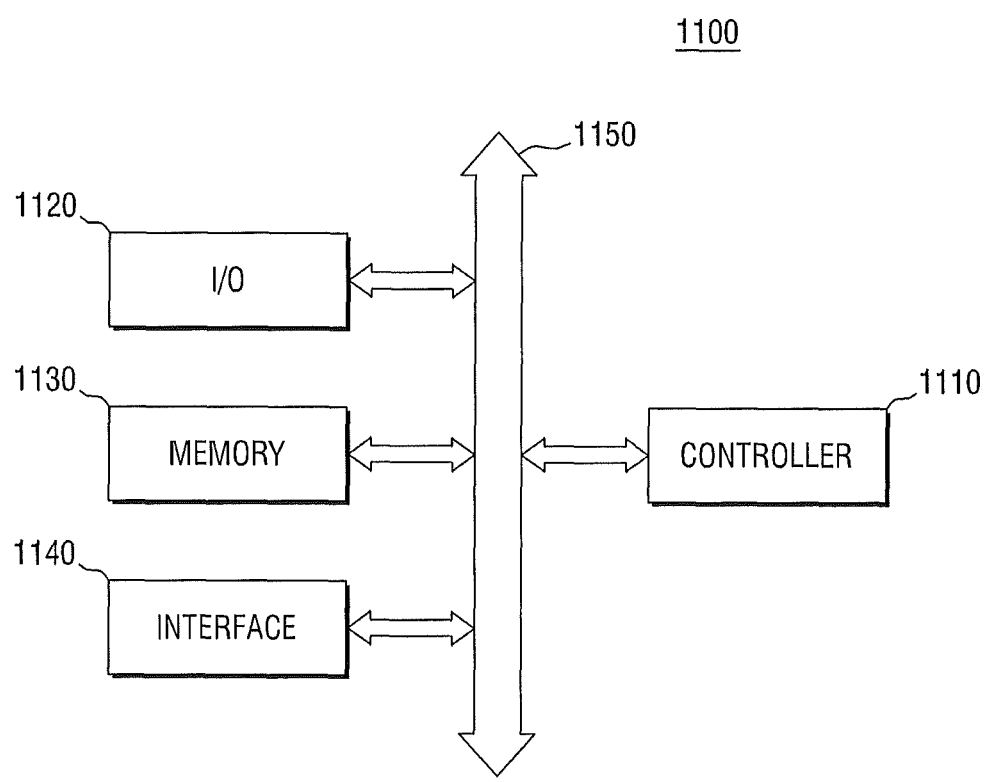
FIG. 16 is a block diagram of an electronic system including a semiconductor device according to some embodiments of the present inventive concept.

FIG. 16 is a block diagram of an electronic system including a semiconductor device according to some embodiments of the present inventive concept.

Referring to FIG. 16, an electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 may correspond to a path through which data moves.

The controller 1110 may include at least one of a microprocessor, a digital signal processor, a microcontroller, and logic elements capable of functions similar to those of these elements. The I/O 1120 may include, for example, a key pad, a key board or a display device. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver. The electronic system 1100 may further include high-speed DRAM and/or SRAM as the working memory for improving the operation of the controller 1110.

A semiconductor device according to some embodiments of the present inventive concept may be provided in the memory device 1130 or may be provided some components of the controller 1110 or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 17:
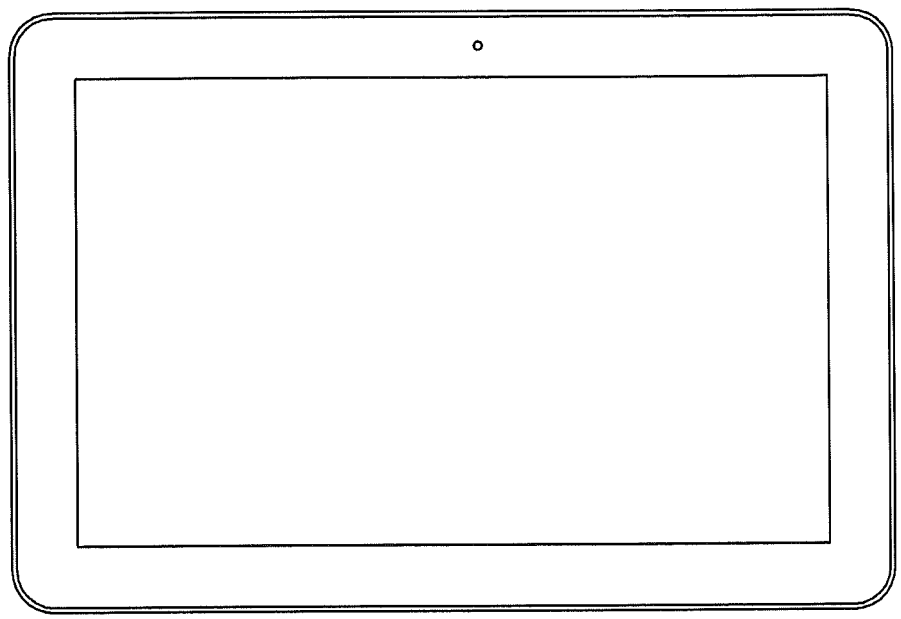
FIGS. 17 and 18 are electronic devices including a semiconductor device according to some embodiments of the present inventive concept.
Figure 18:
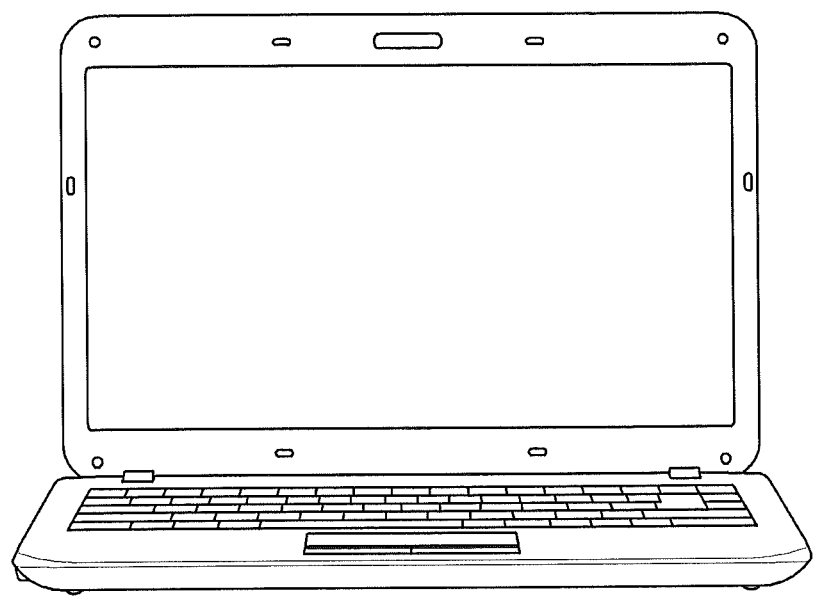

FIGS. 17 and 18 are electronic devices including a semiconductor device, according to some embodiments of the present inventive concept. FIG. 17 illustrates an example in which a semiconductor device according to some embodiments of the present inventive concept is applied to a tablet PC, and FIG. 18 illustrates an example in which a semiconductor device according to some embodiments of the present inventive concept is applied to a notebook computer. At least one semiconductor device according to some embodiments of the present inventive concept may be included in a tablet PC, a notebook computer, or the like. It will be understood that a semiconductor device according to some embodiments of the present inventive concept may also be applied to other IC devices not illustrated herein.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of fabricating a semiconductor device, the method comprising:
    forming an interlayer dielectric layer on a substrate;
    forming a storage node contact passing through the interlayer dielectric layer;
    forming a mold layer on the interlayer dielectric layer and the storage node contact;
    forming a mask pattern on the mold layer, the mask pattern comprising a hole exposing the mold layer;
    forming a noble metal pattern in the hole on the mold layer; and
    forming a storage node hole, laterally overlapping with the storage node contact, in the mold layer by etching the mold layer, wherein the noble metal pattern moves to directly on the storage node contact during the etching,
    wherein the etching the mold layer comprises etching the mold layer using the noble metal pattern as a catalyst, and
    wherein forming the noble metal pattern in the hole comprises:
        forming a noble metal layer on the mask pattern comprising the hole; and
        removing a portion of the noble metal layer until an uppermost surface of the mask pattern is exposed.

2. The method of claim 1, wherein the etching the mold layer comprises performing a wet etching process using the noble metal pattern as a catalyst and using the mask pattern as an etch mask.

3. The method of claim 2, wherein performing the wet etching process comprises performing the wet etching process using an etchant comprising $H_2O_2/HF$, $HCl$, $H_3PO_4$ or $H_2SO_4$.

4. The method of claim 1, further comprising removing the noble metal pattern after the etching of the mold layer.

5. The method of claim 1, wherein upper and lower portions of the storage node hole have a substantially equivalent width.

6. The method of claim 1, wherein forming the noble metal pattern in the hole on the mold layer comprises forming the noble metal pattern laterally overlapping with the storage node contact, and
    wherein the noble metal pattern moves along a direction from an upper surface of the mold layer to a lower surface of the mold layer.

7. A method of fabricating a semiconductor device, the method comprising:
    forming an interlayer dielectric layer on a substrate;
    forming a storage node contact passing through the interlayer dielectric layer;
    forming an etching stop layer on the interlayer dielectric layer;
    forming a mold layer on the etching stop layer;
    forming a mask pattern on an upper surface of the mold layer, the mask pattern comprising a hole exposing the upper surface of the mold layer;
    forming a noble metal pattern in the hole on the upper surface of the mold layer;
    forming a storage node hole, laterally overlapping with the storage node contact, in the mold layer by etching the mold layer using the noble metal pattern as a catalyst, wherein the noble metal pattern moves to directly on the storage node contact during the etching; and forming a first electrode in the storage node hole,
wherein the noble metal pattern comprises a noble metal different from the first electrode and is disposed between the storage node contact and the first electrode, and upper and lower portions of the storage node hole have a substantially equivalent width, and
wherein forming the noble metal pattern in the hole comprises:
forming a noble metal layer on the mask pattern comprising the hole; and
removing a portion of the noble metal layer until an uppermost surface of the mask pattern is exposed.

8. The method of claim 7, wherein forming the noble metal pattern in the hole on the upper surface of the mold layer comprises forming the noble metal pattern laterally overlapping with the storage node contact, and
wherein the noble metal pattern moves along a direction from the upper surface of the mold layer to a lower surface of the mold layer while etching the mold layer.

9. The method of claim 7, further comprising removing the mask pattern after forming the storage node hole.

10. The method of claim 7, wherein the mold layer comprises polysilicon.

11. The method of claim 7, wherein the noble metal pattern comprises Ag, Au, Pt, Al or Cu.

12. The method of claim 7, wherein etching the mold layer comprises etching the mold layer using the mask pattern as an etch mask.

13. The method of claim 7, further comprising forming a recess in the etching stop layer by etching the etching stop layer using the noble metal pattern as a catalyst after etching the mold layer and before forming the first electrode, wherein the noble metal pattern is in the recess and contacts the etching stop layer.

14. A method of forming an integrated circuit device, the method comprising:
forming an insulating layer including a storage node contact on a substrate;
forming an etching stop layer on the insulating layer;
forming a mold layer on the etching stop layer, the etching stop layer extending between the insulating layer and the mold layer;
forming a mask layer on the mold layer, the mask layer comprising a hole exposing an upper surface of the mold layer;
forming a catalyst layer on the mask layer comprising the hole;
forming a catalyst pattern in the hole on the upper surface of the mold layer by removing a portion of the catalyst layer until an uppermost surface of the mask layer is exposed, the catalyst pattern comprising noble metal;
sequentially etching the mold layer and the etching stop layer using the catalyst pattern as a catalyst to form a recess in the mold layer and the etching stop layer, wherein the catalyst pattern moves to directly on the storage node contact during the etching, and the catalyst pattern defines a lowermost surface of the recess; and
forming a lower electrode of a capacitor in the recess.

15. The method of claim 14, wherein the noble metal comprises Ag, Au, Pt, Al or Cu.

16. The method of claim 15, wherein the sequentially etching the mold layer and the etching stop layer comprises performing a wet etching process using an etchant comprising $H_2O_2$/HF, HCl, $H_3PO_4$ or $H_2SO_4$.

17. The method of claim 16, wherein the mold layer comprises polysilicon.

18. The method of claim 14, further comprising removing the catalyst pattern before forming the lower electrode of the capacitor.

19. The method of claim 14, wherein the catalyst pattern and upper and lower portions of the recess have a substantially equivalent width.

20. The method of claim 14, wherein the sequentially etching the mold layer and the etching stop layer comprises etching the mold layer and the etching stop layer using the mask layer as an etch mask.

21. The method of claim 20, wherein the catalyst pattern moves along a direction from an uppermost portion of the recess to the lowermost surface of the recess while etching the mold layer and the etching stop layer.

* * * * *